US011825605B2

(12) United States Patent
Gisby et al.

(10) Patent No.: US 11,825,605 B2
(45) Date of Patent: Nov. 21, 2023

(54) INTERCONNECTING CIRCUIT BOARD TO STRETCHABLE WIRES

(71) Applicant: Sensor Holdings Limited, Auckland (NZ)

(72) Inventors: Todd Alan Gisby, Auckland (NZ); Llewellyn Adair Sims Johns, Auckland (NZ); Andrew Thomas Wong, Auckland (NZ); Felix Qing-Song Lun, Auckland (NZ); Paul Malcolm Guininbert, Auckland (NZ); Jeremy Labrado, Fey (FR); Lewis Freeth Harpham, Auckland (NZ); Elodie Lyath Bouzbib, Les Mesnuls (FR)

(73) Assignee: Sensor Holdings Limited, Auckland (NZ)

( * ) Notice: Subject to any disclaimer, the term of this patent is extended or adjusted under 35 U.S.C. 154(b) by 513 days.

(21) Appl. No.: 16/649,427

(22) PCT Filed: Jul. 24, 2018

(86) PCT No.: PCT/NZ2018/050102
§ 371 (c)(1),
(2) Date: Mar. 20, 2020

(87) PCT Pub. No.: WO2019/022619
PCT Pub. Date: Jan. 31, 2019

(65) Prior Publication Data
US 2021/0298173 A1    Sep. 23, 2021
US 2022/0117090 A9    Apr. 14, 2022

(30) Foreign Application Priority Data

Jul. 24, 2017  (AU) ................................. 2017902901
Aug. 15, 2017  (AU) ................................. 2017903274
(Continued)

(51) Int. Cl.
*H05K 1/18*      (2006.01)
*H05K 1/14*      (2006.01)
(Continued)

(52) U.S. Cl.
CPC ................. *H05K 1/18* (2013.01); *G01D 5/24* (2013.01); *G01L 1/142* (2013.01); *H01R 12/62* (2013.01);
(Continued)

(58) Field of Classification Search
CPC ...... G01D 5/24; G01L 1/142; H01R 12/7076; H01R 43/00; H01R 12/62; H01R 12/79;
(Continued)

(56) References Cited

U.S. PATENT DOCUMENTS 4,573,105 A * 2/1986 Beldavs ................. H05K 3/305
                                                          361/768
4,911,796 A    3/1990 Reed
(Continued)

*Primary Examiner* — Jermele M Hollington
*Assistant Examiner* — Suresh K Rajaputra
(74) *Attorney, Agent, or Firm* — Leason Ellis LLP

(57) ABSTRACT

One aspect of the invention provides an interconnect between a stretchable electronic element and a circuit on a rigid or flexible printed circuit board (PCB Circuit), the stretchable electronic element is operable to be mechanically coupled to a substrate which deforms, and the stretchable electronic element will deform with the substrate and may or may not change an electrical characteristic as a result, the stretchable electronic element comprising one or more electrical pathways; the PCB Circuit configured to communicate electronically with the stretchable electronic element and comprising at least one circuit board extending from the stretchable electronic element to an electrical circuit on the PCB Circuit; wherein the interconnect comprises an electrical coupling between the electrical pathways of the stretchable electronic element and the PCB Circuit; and wherein the interconnect simultaneously prevents the con-
(Continued)

nection between the stretchable electronic element from failing when the stretchable substrate is stretched in normal operation, minimizes the bulk of support material required to support the interconnect, and minimizes any reduction in the stretch capabilities of the stretchable substrate.

18 Claims, 19 Drawing Sheets

(30) Foreign Application Priority Data

| | | |
|---|---|---|
| Sep. 1, 2017 | (AU) | 2017903545 |
| Oct. 31, 2017 | (AU) | 2017904412 |
| Nov. 30, 2017 | (AU) | 2017904845 |

(51) Int. Cl.

| | |
|---|---|
| *H01R 12/70* | (2011.01) |
| *H01R 12/62* | (2011.01) |
| *H01R 12/79* | (2011.01) |
| *H01R 43/00* | (2006.01) |
| *H05K 3/32* | (2006.01) |
| *G01D 5/24* | (2006.01) |
| *G01L 1/14* | (2006.01) |

(52) U.S. Cl.
CPC ......... *H01R 12/7076* (2013.01); *H01R 12/79* (2013.01); *H01R 43/00* (2013.01); *H05K 1/147* (2013.01); *H05K 3/321* (2013.01); *H05K 3/326* (2013.01); *H05K 2201/10151* (2013.01)

(58) Field of Classification Search
CPC .......... H05K 3/321; H05K 3/326; H05K 1/18; H05K 1/189; H05K 1/147; H05K 1/0271; H05K 2201/10151; H05K 1/095; H05K 2201/0329; H01G 5/18; H01G 5/40
See application file for complete search history.

(56) References Cited

U.S. PATENT DOCUMENTS

| | | | |
|---|---|---|---|
| 2007/0043725 A1 | 2/2007 | Hotelling et al. | |
| 2016/0238368 A1* | 8/2016 | O'Brien | G01L 1/20 |
| 2017/0099730 A1* | 4/2017 | Iwase | H05K 1/0283 |
| 2017/0191819 A1* | 7/2017 | O'Brien | G01L 5/165 |
| 2019/0339141 A1* | 11/2019 | Gisby | G01L 1/14 |

* cited by examiner

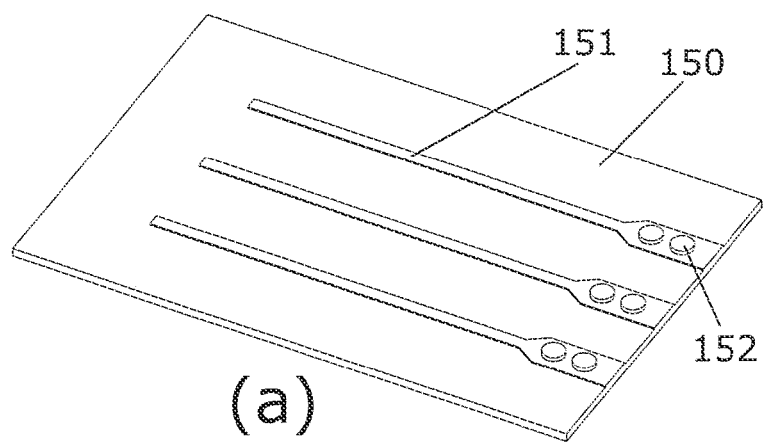
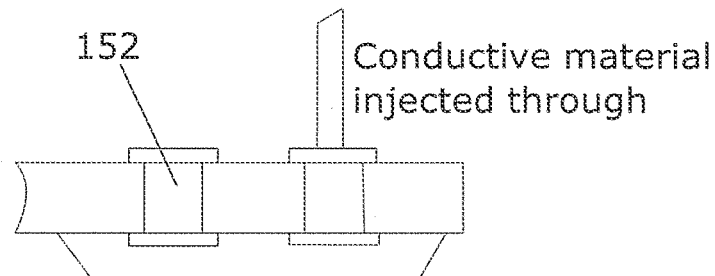
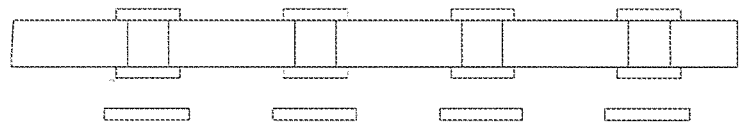
Figure 12
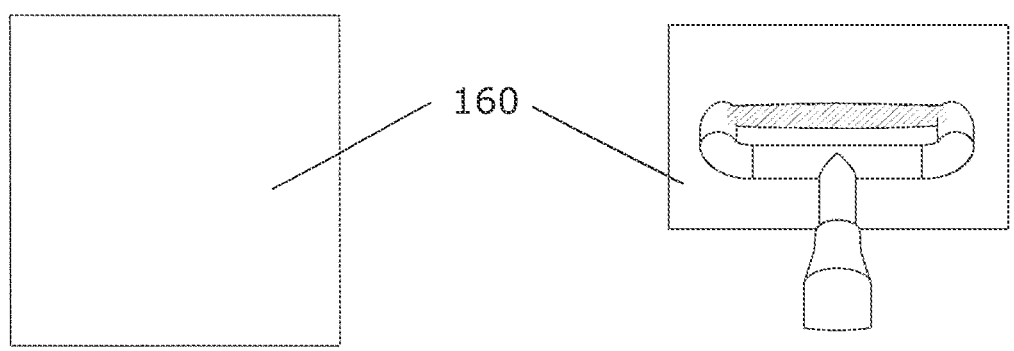
Figure 13                Figure 14

INTERCONNECTING CIRCUIT BOARD TO STRETCHABLE WIRES

CROSS-REFERENCE TO RELATED PATENT APPLICATIONS

This application is a U.S. National Phase Application under 35 U.S.C. § 371 of International Patent Application No. PCT/NZ2018/050102, filed Jul. 24, 2018, which claims the priority of AU Patent Application No. 2017902901, filed Jul. 24, 2017, AU Patent Application No. 2017903274, filed Aug. 15, 2017, AU Patent Application No. 2017903545, filed Sep. 1, 2017, AU Patent Application No. 2017904412, filed Oct. 31, 2017, and AU Patent Application No. 2017904845, filed Nov. 30, 2017, each of which is incorporated by reference as if expressly set forth in their respective entirety herein.

FIELD OF THE INVENTION

This invention generally relates to improvements in respect of interfacing stretchable electronics with conventional electronics mounted on a rigid or semi-rigid Printed Circuit Board Assemblies (PCBA). In particular, the present invention relates to the interconnection of PCBA to stretchable wires deposited on stretchable substrates.

BACKGROUND

Capacitive sensors are known to provide capacitance-deformation characteristics which can be used in various cases to sense, measure or instrument deformation.

A common application of capacitive sensors is to measure deformation in a non-rigid body. It is often desirable in these applications that the sensors are sufficiently soft and compliant that they do not interfere with the deformation to be measured. The need for a high degree of compliance and flexibility may be more relevant in applications where the body concerned is that of a human, animal or other organism as the sensor may otherwise have an impact on deformation of the body to be measured.

It is often desirable to make multiple measurements of deformation to capture complex movements or configurations of a body.

A challenge in using multiple sensors is in wiring the sensors to electronics used to make measurements of the capacitance of sensors. This challenge is exacerbated by a common tendency for wiring to have limited flexibility or compliance. In particular, there is a problem of connecting flexible electrical conductors to rigid or semi rigid electrical conductors. For example, connecting a stretchable wire deposited on a stretchable substrate to a rigid or flexible PCB assembly. Connecting two electrical conducting substrates of this type typically presents a problem where a point of failure arises due to the differing flexibility of the substrates in connection.

This challenge is shared in the creation of an electromechanical interface between other stretchable electronic elements such as stretchable sensors, stretchable cables, stretchable connectors, stretchable circuit elements, and stretchable energy harvesting components. Where mention of a stretchable sensor is made, the word "sensor" can be substituted for any of the above alternative stretchable electronic elements that also require an electrical and mechanical connection between stretchable elements and flexible and/or rigid elements such as PCBs that is robust to significant stretching.

It is an object of the present invention to go at least some way toward overcoming the above-mentioned problem or to at least provide the public with a useful choice.

In this specification, where reference has been made to external sources of information, including patent specifications and other documents, this is generally for the purpose of providing a context for discussing the features of the present invention. Unless stated otherwise, reference to such sources of information is not to be construed, in any jurisdiction, as an admission that such sources of information are prior art or form part of the common general knowledge in the art.

SUMMARY OF THE INVENTION

According to one aspect of the invention there is provided an interconnect between a stretchable electronic element and a circuit on a rigid or flexible printed circuit board (PCB Circuit), the stretchable electronic element is operable to be mechanically coupled to a substrate which deforms, and the stretchable electronic element will deform with the substrate and may or may not change an electrical characteristic as a result, the stretchable electronic element comprising one or more electrical pathways; the PCB Circuit configured to communicate electronically with the stretchable electronic element and comprising at least one circuit board extending from the stretchable electronic element to an electrical circuit on the PCB Circuit; wherein the interconnect comprises an electrical coupling between the electrical pathways of the stretchable electronic element and the PCB Circuit; and wherein the interconnect simultaneously prevents the connection between the stretchable electronic element from failing when the stretchable substrate is stretched in normal operation, minimizes the bulk of support material required to support the interconnect, and minimizes any reduction in the stretch capabilities of the stretchable substrate.

A stretchable electronic element may be a laminated device comprising two or more electrode films of elastomeric material having a dispersion of conductive particles to provide compliant conductive electrodes and comprising one or more dielectric film(s) of elastomeric material separating the conductive electrodes to provide a compliant dielectric for a capacitor formed by the electrode films wherein the capacitance of the capacitor varies with deformation of the films.

Preferably the stretchable electronic element has been created with an area of reduced planar strain corresponding to the area in which the stretchable electronic element comes into contact with the circuit board element.

Preferably the area of reduced strain in the stretchable electronic element has been implanted with one or more pieces of 'non-stretch' or low-strain material at some point during or after the manufacture of the stretchable electronic element.

Preferably the area of reduced strain could extend out further than the area of contact between the flexible electronic component and the PCB circuit.

Preferably the interconnect comprises landing pads disposed between the electrical pathways of the stretchable electronic element and the PCB Circuit, or alternatively, the landing pads are integrally part of the electrical pathway of the stretchable electronic element.

Preferably the landing pads are formed from stretchable, electrically conductive material.

Preferably the interconnect comprises an electrical conductor extending vertically from the electrical pathways of the stretchable electronic element and toward the PCB Circuit, or alternatively, are the same height as the electrical pathways of the stretchable electronic element.

Preferably the electrical conductor comprises a conductive polymer.

Preferably the conductive polymer is formed as a bump or frustospherical formation on the upper or contacting surface of the electrical pathway of the stretchable electronic element, or alternatively, formed on the lower or contacting surface of the PCB Circuit.

Preferably the PCB Circuit comprises a connecting pad connected to the electrical pathways on the PCB circuit.

Preferably the PCB Circuit comprises a connecting pad comprising a bump on the lower or contacting surface.

Preferably the PCB Circuit bump comprises a high conductivity material including at least one of gold, silver, aluminium, copper, or carbon.

Preferably the PCB Circuit bump is arranged to at least partially penetrate the electrical pathways of the stretchable electronic element.

Preferably the PCB Circuit is secured to the stretchable substrate to thereby secures the interconnect by one or more of an adhesive, and/or a fastener.

Preferably a stretchable material with the thickness that tapers from a maximal thickness of the PCB circuit down to the thickness of the stretchable electronic element over a distance of several millimetres extending perpendicularly out from the perimeter of the PCB Circuit. Preferably, the gradient of reduction in thickness is not less than 0.1 mm per mm that extends out from the perimeter of the PCB Circuit.

Preferably the stretchable substrate is layered between the PCB Circuit and a support plate, to form a laminate structure, and wherein the laminate is secured by one or more of an adhesive, and/or a fastener.

According to a further aspect of the present invention there is provided a method of connecting to a stretchable electronic element to a supporting electrical circuit, the stretchable electronic element being mechanically coupled to a substrate which deforms, and has an electrical characteristic that changes as a result of the deformation, the stretchable electronic element comprising one or more electrical pathways;

wherein the supporting electrical circuit comprises a sensing circuit configured to measure the electrical characteristic of the stretchable electronic element and comprising at least one circuit board extending from the sensing circuit to the stretchable electronic element; wherein the method comprises providing an interconnect between the stretchable electronic element and the sensing circuit, the interconnect comprising an electrical coupling between the electrical pathways of the stretchable electronic element and the circuit board of the sensing circuit; and wherein the interconnect simultaneously prevents the connection between the stretchable electronic element from failing when the stretchable substrate is stretched in normal operation, minimizes the bulk of support material required to support the interconnect, and minimizes any reduction in the stretch capabilities of the stretchable substrate.

According to yet another aspect of the present invention there is provided an assembly comprising:
 a substrate which deforms that is mechanically coupled to a stretchable electronic element, the stretchable electronic element comprising one or more electrical pathways; one or more stretchable wires deposited on the substrate;
 a circuit board comprising one or more electrically conductive tracks on at least a first surface;
 wherein the one or more electrically conductive tracks on the circuit board comprise one or more cavities or vias that extends through the circuit board; and
 wherein the one or more stretchable wires align with the one or more cavities or vias associated with an electrically conductive track on at least a first surface of the circuit board that connects the electrical pathway of the stretchable electronic element to the circuit on the circuit board.

Preferably the stretchable wires extend vertically from the substrate to the circuit board and at least partway into the cavity or via and forms an electrical pathway that extends from the one or more stretchable wires to the one or more electrically conductive tracks on the circuit board.

Preferably the circuit board includes at least one cavity extending either partway or completely through the thickness of the circuit board for each conductive track, and the one or more stretchable wires extends from the stretchable substrate to the circuit board and at least partway into the one or more cavities.

Preferably a bias pressure is applied to cause the stretchable wires to elastically deform where they align with the conductive pads on the circuit board.

Preferably the cavities are internally plated with electrically conductive material creating a PCB 'via' so as to increase the electrically conductive interfacial surface area between the electrically conductive track and the stretchable wire material.

Preferably electrically conductive material is deposited or injected into the cavity and cured or set to improve the electrical and mechanical connection between the stretchable wire and the conductive track on the circuit.

Preferably the conductive metal pads surrounding the cavities are over-etched during PCB manufacture in order to provide a ledge that electrically conductive material can mechanically latch onto.

Preferably the electrically conductive material comprises a solvent that evaporates when cured or set causing the conductive material to shrink and create additional bias pressure that acts to hold the stretchable wires of the stretchable electronic element and the conductive pads of the circuit board in contact.

Preferably where a single conductive track on the circuit comprises more than one cavity or via, the electrically conductive material deposited or injected into each cavity or via forms a bridge of electrically conductive material spanning the cavities or vias across the opposite surface of the PCB to the surface of the PCB making contact with the stretchable electronic element.

According to a further aspect of the present invention there is provided a method of assembling a stretchable electronic element on a flexible and deformable substrate and an electrical circuit board, comprising:
 providing a stretchable substrate;
 providing an electrical circuit board with a conductive track thereon, the conductive track comprising one or more cavities or vias;
 depositing stretchable wire material onto the stretchable substrate and locating the one or more cavities or vias on top of the stretchable wire material;
 depositing stretchable conductive wire material into one or more of the one or more cavities or vias; and
 curing or setting the stretchable conductive material.

Preferably the mating of the stretchable electronic element with the conductive element on the PCB and the method by which the PCB Circuit is secured to the substrate creates a bias force opposed by a force due to the elastic deformation of one or more of the stretchable electronic element, the landing pads, or the PCB Circuit bumps.

Preferably a biasing mechanism is used to maintain a force holding the stretchable electronic element in contact with the PCB circuit.

Preferably the biasing mechanism may comprise a spring.

Preferably the spring may be a leaf spring.

Preferably the biasing mechanism may comprise a tension element operable to transfer force from the spring to the PCB circuit to anchor the spring in a compressed state to provide a biasing force between the PCB circuit and stretchable electronic element.

The circuit board may have an anchor feature for the tension element.

The tension element may be a pin.

The anchor feature may be an aperture formed in the PCB circuit.

According to another aspect of the present invention is provided an assembly comprising:
- a stretchable substrate incorporating a stretchable electronic element which is mechanically coupled to the stretchable substrate, the stretchable electronic element comprising one or more electrical pathways;
- one or more stretchable wires located on the stretchable substrate; a circuit board comprising one or more electrically conductive tracks on at least a first surface facing the substrate;
- wherein the stretchable substrate is at least partly coated with an adhesive in at least a region between the circuit board and stretchable substrate to thereby bond the circuit board and stretchable substrate so as to cause and maintain an alignment between at least one of the one or more electrically conductive tracks with at least one of the one or more stretchable wires.

Preferably the bonding agent is silicone.

Preferably the bonding agent is cured by heating.

Preferably while the bonding agent is cured, a bias pressure is applied to the circuit board to cause the landing pads and/or the ends of the stretchable wire to elastically deform and provide a reciprocal force to oppose the bias pressure while the bonding agent is being cured.

Preferably the bonding agent is applied to the substrate, or alternatively, to the circuit board.

Preferably the addition of additional electrically conductive material to the interconnection of the stretchable wires and the conductive pathways on the circuit board are formed on the substrate after the bonding agent is applied.

Preferably a stretchable material with the thickness that tapers from a maximal thickness of the PCB circuit down to the thickness of the stretchable electronic element over a distance of several millimetres extending perpendicularly out from the perimeter of the PCB Circuit. Preferably, the gradient of reduction in thickness is not less than 0.1 mm per mm that extends out from the perimeter of the PCB Circuit.

According to another aspect of the present invention is provided an assembly comprising:
- a stretchable substrate such as a stretchable fabric or an elastomer for example; one or more stretchable electronic element which is mechanically coupled to the stretchable substrate, the stretchable electronic element being functionally operable over strains of at least 20%, or more preferably at least 15%, or still more preferably at least 10%, or still more preferable at least 5%, the stretchable electronic element comprising one or more electrical pathways; one or more stretchable wires electrically connected to the electrical pathways of the stretchable electronic element and that are mechanically coupled to the stretchable substrate;
- a circuit board comprising one or more electrically conductive tracks on at least a first surface facing the stretchable substrate, with one or more cavities or vias passing through the conductive pads electrically connected to the conductive tracks at the locations where the conductive pads align with the stretchable wires;
- wherein the stretchable substrate is at least partly coated with an adhesive in at least a region between the circuit board and stretchable substrate to thereby bond the circuit board and stretchable substrate so as to cause and maintain an alignment between at least one of the one or more electrically conductive tracks with at least one of the one or more stretchable wires;
- wherein electrically conductive polymer is injected into the cavities or vias and cured to improve the electrical and mechanical interconnection between the stretchable wires and the conductive tracks on the circuit, and in the case of multiple cavities or vias that are related to one conductive pad or track excess material fills all cavities or vias connected to that conductive track and, where the cavities or vias pass all the way through the circuit board, bridges the span between the cavities or vias on the opposing side of the circuit board to where the stretchable wires make contact with the circuit board; and
- wherein an additional stretchable polymer reinforcement layer is deposited around the perimeter of the circuit board that tapers from a maximal thickness over the circuit board to zero thickness at a distance of several millimetres at a thickness gradient no less than 0.1 mm per mm from the edge of the circuit board measured perpendicularly to the edge of the circuit board.

Preferably the bonding agent and the reinforcement layer is silicone.

Preferably the bonding agent and the reinforcement layer is cured by heating, or alternatively, by exposure to UV light.

Preferably while the bonding agent is cured, a bias pressure is applied to the circuit board to cause the landing pads and/or the ends of the stretchable wire to elastically deform and provide a reciprocal force to oppose the bias pressure while the bonding agent is being cured, thereby at least partially locking in the elastic deformation once the bonding agent is cured.

Preferably the bonding agent is applied to the substrate, or alternatively, to the circuit board.

Preferably the interconnection of the stretchable wires and the conductive pathways on the circuit board and the tapered elastic polymer reinforcement on around the edge of the circuit board are formed on the substrate at the same time or after the bonding agent is applied.

Preferably at least one stretchable electronic element is interconnected to the circuit board using the embodied invention. More preferably at least one stretchable electronic element is interconnected with the circuit board on each edge of the board. More preferably at least 8 stretchable electronic elements are interconnected with the circuit board using the embodied invention. More preferably at least 15 stretchable electronic elements are interconnected with the circuit board using the embodied invention. More preferably at least 15 stretchable electronic elements are interconnected with the circuit board using the embodied invention. More preferably at least 30 stretchable electronic elements are interconnected with the circuit board using the embodied invention. More preferably at least 50 stretchable electronic elements are interconnected with the circuit board using the embodied invention.

According to yet another aspect of the invention there is provided a method of assembling a stretchable electronic element on a stretchable substrate and an electrical circuit board, comprising:

providing a stretchable substrate having a stretchable wire disposed thereon; providing an electrical circuit board with a conductive track thereon;

applying a bonding agent to either the stretchable substrate, or circuit board, or both;

abutting the stretchable wire with the conductive track;

applying a temporary bias pressure to elastically deform the stretchable wires and/or the landing pads between the stretchable wires and the conductive pads on the circuit board; and curing the bonding agent and removing the temporary bias pressure.

According to yet another aspect of the invention there is provided a method of assembling a stretchable electronic element on a stretchable substrate and an electrical circuit board, comprising:

providing a stretchable substrate having a stretchable wire disposed thereon; providing an electrical circuit board with a conductive track thereon;

applying a surface treatment to break molecular bonds on the surface of the stretchable substrate and stretchable wires to promote bonding, such as corona or plasma treatment or chemical etching for example;

applying a bonding agent to either the stretchable substrate, or circuit board, or both; abutting the stretchable wire with the conductive track;

applying a temporary bias pressure to elastically deform the stretchable wires and/or the landing pads between the stretchable wires and the conductive pads on the circuit board; and curing the bonding agent and removing the temporary bias pressure.

Note, applying a surface treatment to break molecular bonds on the surface of the stretchable substrate and stretchable wires to promote bonding, such as corona or plasma treatment or chemical etching for example may be used in addition to any of the aforementioned embodiments prior to the circuit board being brought into contact with the stretchable substrate to align and interconnect the electrical pathways of the stretchable wires align and overlap with the conductive pads or tracks of the circuit board.

One aspect of the invention provides an interconnect for an array of deformation sensors and an electronic circuitry which determines deformation metrics based on electronic characteristics of the array of sensors, the sensor array formed on a flexible substrate, the interconnect comprising:

a contact surface operable to be bonded to the flexible substrate of the sensor array;

a set of sensor terminals located on the contact surface and arranged in a pattern which is complementary to a pattern of terminals of the sensor array to the sensor array to connect to the sensor terminals when the contact surface is bonded to the substrate; and a set of circuitry terminals to connect to electronic circuitry.

The interconnect may comprise apertures to admit liquid conductive material to be cured to connect the sensing terminals on the interconnect to the terminals on the sensor. The contact surface and/or sensing terminals may be operable for the sensing terminals and the terminals of the sensor to be bonded by a cured elastomeric material.

The interconnect may be operable to be bonded to the substrate by bonding material comprising liquid material which cures.

The interconnect may comprise a flexible circuit element on which the sensor terminals and circuitry terminals are located.

The circuitry contacts may comprise terminals for a signal leads and shielding for the signal leads.

The interconnect may comprise a plug which includes the circuitry contacts and which is operable to mount a circuit board for electronic circuitry.

Another aspect of the present invention comprises a sensing apparatus comprising an array of soft electronic components formed on a flexible substrate and comprising electronic circuitry interconnected to the array, the interconnect comprising:

a contact surface operable to be bonded to the flexible substrate of the sensor array;

a set of sensor terminals located on the contact surface and arranged in a pattern which is complementary to a pattern of terminals of the array to the array to connect to the sensor terminals when the contact surface is bonded to the substrate;

a set of circuitry terminals to connect to electronic circuitry.

Another aspect of the invention provides an interconnect for an array of soft electronic components and an electronic circuitry, the soft electronic components formed on a flexible substrate, the interconnect comprising:

a contact surface operable to be bonded to the flexible substrate of the sensor array;

a set of sensor terminals located on the contact surface and arranged in a pattern which is complementary to a pattern of terminals of the array to the array to connect to the sensor terminals when the contact surface is bonded to the substrate;

a set of circuitry terminals to connect to electronic circuitry.

Aspects of the invention interconnect elastomeric terminals of a soft electronic component array formed on a stretchable to a printed circuit board using a transitional element between the array and printed circuit board, wherein the transitional element has a contact surface operable to bond to the stretchable substrate.

Aspects of the invention interconnect elastomeric terminals of a soft electronic component array formed on a stretchable to a printed circuit board using a transitional element between the array and printed circuit board, wherein the transitional element has sensor terminals for the soft electronic array which are operable to receive elastomeric conductive material in a pre-cured state so as to electrically and mechanically connect the sensor terminals of the transitional element to soft elastomeric terminals of the soft electronic component array.

In one aspect the present invention provides a device comprising a first component comprising two or more electrode films of elastomeric material having a dispersion of conductive particles to provide compliant conductive electrodes and comprising one or more dielectric film(s) of elastomeric material separating the conductive electrodes to provide a compliant dielectric for a capacitor formed by the electrode films wherein the capacitance of the capacitor varies with deformation of the films, wherein one or more electrode film(s) overlays a non-compliant electrode of a second component to provide connection of the first component to the second component, and wherein the device comprises one of more strain mitigation element(s) operable to mitigate strain in a zone withing the first component, said zone being substantially parallel with a surface defining the bond of electrodes of the first and second components. The connection provided may be electrical. The connection provided may be mechanical.

The strain mitigated may otherwise result from a stress applied in a direction away from the second component and substantially parallel with the surface defined by a bond between the electrodes of the first and second components.

The second component may be substantially planar.

The second component may be rigid.

The second component may comprise a printed circuit board.

The first component may be in the form of a sheet of material.

The strain mitigation element may be non-stretchable in at least one direction.

The strain mitigation element may be flexible.

The strain mitigation element may comprise a sheet of material.

An film providing a conductive electrode may have a higher Young's modulus than a film providing a dielectric. The first component may comprise one or more encapsulating layers to encapsulate the conductive electrodes and separating dielectrics.

The first component may comprise a a first conductive electrode arranged between overlapping second and third conductive electrodes which provide shielding for the first conductive electrode.

Aspects of the present invention provide a device comprising a soft electronic component having one or more electrodes bonded to a circuit board, wherein the device further comprises a strain-resistant element which is anchored with respect to the circuit board and which is operable to engage the soft electronic component to balance in the soft component strain at a distance from the circuit board and strain proximate the circuit board, said strain resulting from a stress substantially parallel with the circuit board in a direction away from the circuit board.

Aspects of the present invention provide a device comprising a soft electronic component having one or more electrodes bonded to a circuit board, wherein the device further comprises a strain-resistant element which is anchored with respect to the circuit board and which is operable to engage the soft electronic component to resist strain occurring in the component. The strain-resistant element may be operable to resists strain in the soft electronic a distance from the the circuit board.

The strain-resistant element may engage the soft electronic component on an opposite side of the electrodes to the circuit board.

The strain-resistant element may be operable to resist strain substantially parallel to the circuit board.

The soft electronic component may comprise a sheet of laminated material.

The strain-mitigation zone may be parallel to the circuit board.

The strain-mitigation zone may be located at a surface of the soft electronic component which is distal the electrodes of the component bonded to the circuit board.

The strain resistant element may resist strain in the soft electronic component to mitigate any imbalance of strain at said opposite surface compared to a surface at which the soft electronic component is bonded to the printed circuit board.

The strain resistant element may be operable to resist strain which results from a stress substantially aligned with the printed circuit board.

Said stress substantially aligned may be a stress which is within 45 degrees of a plane defined by the printed circuit board.

The strain resistant element may be non-stretchable in at least one direction.

The strain resistant element may be flexible.

The strain resistant element may comprise a sheet of material.

As used herein the term 'circuit board' is intened to be construed broadly as a board comprising electrode elements and is not intended to be limited to having a completed circuit.

As used herein the term 'strain' refers relative deformation or change in shape and size of elastic, plastic, and fluid materials under applied stress.

As used herein the term 'stress' is a force applied per unit of cross-sectional area.

As used herein herein the term 'zone' is intended to be construed broadly and includes, for example, a volume.

The following embodiments may relate to any of the above aspects. Other aspects of the invention may become apparent from the following description which is given by way of example only and with reference to the accompanying drawings.

As used herein the term "and/or" means "and" or "or", or both.

As used herein "(s)" following a noun means the plural and/or singular forms of the noun.

The term "comprising" as used in this specification means "consisting at least in part of". When interpreting statements in this specification which include that term, the features, prefaced by that term in each statement or claim, all need to be present but other features can also be present. Related terms such as "comprise" and "comprised" are to be interpreted in the same manner.

As used herein the term "measure", or similar, refers broadly to any known means for determining a parameter value and includes but is not limited to finding an approximation for a parameter value.

As used herein the term "sensing", or similar refers broadly to any known means for knowing a parameter value or knowing that a parameter value has changed and includes but is not limited to finding an approximation for a parameter value.

This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting.

In one aspect the invention provides an interconnect for a soft electrical component the component comprising one or more soft electrodes, the interconnect connecting one or more of the one or more soft electrodes to a rigid electronic component, the interconnect having a body which defines one or more cavities to receive an anchoring part of the soft electronic component, the interconnect having one or more component contacts arranged to be in contact with an electrode of the soft component when said anchoring part of the soft electronic component is received in the cavity to provide an electrical interconnection for the soft electronic component and the rigid electronic component.

The anchoring part may be formed of electrode material and extend from an electrode.

The cavity may have an opening for the anchoring part of the soft electronic component wherein the opening is narrowed.

The cavity may have an opening for the soft electronic component which is narrower than another part of the cavity to retain the part of the soft component in the cavity.

The cavity may have a constricted opening to retain the anchor of the soft electronic component.

The cavity may comprise a region which is confined other than the opening of the cavity to constrain a substantially incompressible anchoring part to taking a shape which is wider than the opening of the cavity to retain said part in the cavity and locate an electrode of the soft electronic component against the contact.

The contact may be located adjacent to the cavity opening.

The cavity opening may be defined by the contact.

The cavity may be formed in the component contact of the interconnect.

The cavity may be defined by two or more projections formed in a surface of the interconnect.

The cavity may extend for a length.

The cavity may extend from an edge of the interconnect.

The interconnect may comprise a circuit board interface to connect a circuit board to one or more soft electronics components. The interconnect may be operable to receive a circuit board. The interconnect may be operable to locate a circuit board.

The interconnect may comprise one or more contacts for electronic circuitry to be interconnected with the soft electronic component.

The one or more electronics contacts may be connected electrically to one or more respective component contacts.

The one or more electronics contacts may be arranged to connect with respective one or more cooperating contacts on a printed circuit board.

The interconnect may comprise a layer of conductive material and the cavity may be formed by etching the conductive material.

The interconnect may comprise a layer of conductive material and the cavity may be formed by etching a layer of substrate material below the conductive material.

The cavity may be formed by etching to an extent that an overhang in the etched cavity is formed to provide the narrowed opening.

The interconnect may be formed of a printed circuit board comprising a conductive layer on a substrate, wherein the one or more component contacts are provided by one or more regions of said conductive layer.

The cavity may be formed by etching of the conductive layer to the extent that conductive material at one or more defining edges of the opening overhangs part of the cavity. The overhung part of the cavity may provide a receiver part of the cavity to receive the anchoring part.

An end of a cavity distal from the opening of the cavity may be defined by a substrate of a printable circuit board material from which conductive material has been etched to define a cavity opening.

A single interconnect may comprise multiple cavities in the conductive material.

A height of the cavity may be increased and/or an area of the opening can be decreased by plating additional material on top of the conductive material.

In one aspect the present invention provides a process for manufacturing a soft electronic component with an integrated connector for electronic circuitry, the process comprising the steps of:

providing a connection component having contacts for electronic circuitry and defining one or more cavities in the connection component;

applying an anchoring material to the connection component so as to cause ingress of the anchoring material into the cavity; and curing the anchor material to provide an anchor in the cavity for the soft electronic component.

The anchoring part may be formed of an elastomer.

The process may comprise applying electrode material to the connector to provide an electrode of the soft electronic component which is in contact with the connector.

The electrode material may comprise material which may bond to the anchoring material to allow anchoring material to be anchored to the connector component.

The electrode material may be applied prior to curing the anchoring material. The electrode material may be cured.

Electrode material may be used as anchoring material.

The cavity may have an opening for the anchoring material which is narrower than another dimension of the cavity so as to retain the anchoring material in the cavity.

The process may comprise removing excess anchoring material from the connector.

The electrode material and/or the anchoring material may be operable to shrink as it is cured.

The electrode material may comprise solvent which disperses conductive particles and causes shrinking upon curing of the electrode material.

The process may comprise the step of forming one or more electrodes of the soft electronic component by applying electrode material in a liquid form and may comprise the step of curing the material.

Aspects of the present invention may comprise a soft electronic component with an integrated connector for electronic circuitry, wherein the soft electronic component comprises an anchoring part which is formed by curing and/or setting and which shrinks by curing and/or setting wherein said shrinkage acts to force the anchoring part of the soft electronic component against one or more edges of the cavity and/or against a contact proximate the cavity.

Aspects of the present invention provide a soft electronic component with an integrated connector for electronic circuitry, wherein the soft electronic component comprises an anchoring part which is formed by curing and which shrinks by curing and/or setting and which is in contact with an anchoring part of the connector wherein said shrinkage acts to force the anchoring part of the soft electronic component against one or more component contacts provided to electrically connect one or more electrodes of the soft electronic component.

Aspects of the present invention provide a process for manufacturing a soft electronic component with an integrated connector for electronic circuitry, wherein the process comprises a step of an anchoring part of the soft electronic component in a liquid state to an anchoring part of the connector and curing the anchoring part of the soft electronic component to fix it in mechanical engagement with an anchoring part of the soft electronic component.

The anchoring part of the soft electronic component may comprise soft conductive material in a cured state.

Aspects of the present invention provide a soft electronic component with an integrated connector for electronic circuitry, the connector having one or more cavities operable to retain an anchoring part of the soft electronics component when the anchoring part is cured.

Aspects of the present invention provide a soft electronic component with an integrated connector for electronic circuitry the integrated sensor and connector comprising a material which is formed from a precursor material by setting and/or curing and a cavity formed in the connector which is entered by the precursor material and retained by the cavity when set and/or cured.

Aspects of the present invention provide a soft electronic component with an integrated connector for electronic circuitry the integrated sensor and connector comprising a material which is formed from a precursor material by setting and/or curing and a cavity formed in the connector which is entered by the precursor material wherein the cavity is shaped to retain material which has entered the cavity and then set and/or cured.

The cavity may have an opening for the precursor material to enter wherein the cavity is narrow relative to another part of the cavity.

The connector may comprise an electrical contact located to be in contact with the soft electronics component.

Aspects of the present invention provide a soft electronic component with an integrated connector for electronic circuitry the integrated sensor and connector comprising a material which is formed from a precursor material by setting and/or curing and a cavity formed in the connector which is entered by the precursor material wherein the soft electronics component comprises material which changes volume such that that the set and/or cured material is forced against a part of the connector. The change in volume may be shrinkage. The change in volume may be expansion.

The cavity may be arranged such that forces created by shrinkage act to retain part of the soft electronics component in the cavity.

The connector may have an electrical contact arranged to be in contact with a conductive part of the soft electronics component.

The soft electronics component may be formed of material which is elastic.

The soft electronics component may be formed of material which is substantially incompressible.

The soft electronics component may be a capacitor.

The soft electronics component may be a conductive trace leading to a capacitor.

The trace may be a shielded trace comprising a signal electrode and one or more shielding electrodes arranged to provide electrostatic and/or electromagnetic shielding of the signal electrode.

The soft electronics component may be a capacitor that may be adapted to change in capacitance as the soft electronics component is deformed.

The soft electronics component may be a sensor.

The soft electronic component may be formed of one or more layers of soft dielectric material and one or more layers of a soft conductive material.

The soft electronic component may be formed of one or more layers of material with a dielectric property and two or more layers of a soft conductive material separated by the layer of dielectric material to provide electrodes of a capacitor.

The soft electronic component may comprise films of elastomeric material.

The soft electronic component may comprise films of triboelectric material.

Aspects of the present invention provide a soft electronic component with an integrated connector for electronic circuitry the integrated soft electronics component and connector comprising a material which is formed from a precursor material by setting and/or curing and comprising a ledge formed in the connector wherein the soft electronics component comprises material which shrinks so that the set and/or cured material is forced against the ledge.

Aspects of the present invention provide a soft electronic component with an integrated connector for electronic circuitry, the integrated soft electronics component and connector comprising a material which is formed from a precursor material by setting and/or curing and an undercut formed in the connector wherein the soft electronics component comprises material which shrinks so that the set and/or cured material is forced against the undercut.

Aspects of the present invention provide a connection between a solid electronic component and a soft electronic component, wherein one or other of the components are formed by a process comprising expansion or shrinkage which provides a contact force between the components to form an electrical and/or mechanical connection.

Aspects of the present invention provide a connection between a solid electronic component and a soft electronic component, wherein flexing by the soft electronic component causes abrasion against the solid electronic component. This may mitigate the build-up of oxides or other chemical layers.

Other aspects may comprise the component or process of any of the paragraphs above with liquid substituted by mouldable and solid substituted by moulded.

Other aspects may comprise the component or process of any of the paragraphs above with liquid substituted by settable and solid substituted by set.

Other aspects may comprise the component or process of any of the paragraphs above with liquid substituted by settable and solid substituted by set.

Other aspects of the invention may comprise any combination or permutation of features recited in any of the paragraphs above.

As used herein the term 'solid' is intended for broad interpretation as not in liquid or gaseous states, and includes elastic, soft, and malleable and compliant solids to name a few examples.

As used herein the term 'liquid' is intended for broad interpretation to include gels, and fluids.

As used herein the term 'electronic component' is intended to be interpreted broadly to include leads and traces and includes soft electronic components.

As used herein the term 'electrode' is intended to be interpreted broadly to include any conductive part of a soft electronic component.

As used herein the article "a" is not intended to be limited have the meaning of "one".

As used herein the term 'cavity' is defined broadly to include any concave space with an opening.

Where mention of a stretchable sensor is made, the word 'sensor' can be substituted for any of the above alternative soft electronic elements that also require an electrical and mechanical connection between stretchable elements and flexible and/or rigid elements such as PCBs that is robust to significant stretching.

Note stretchable for these electronic elements may be defined to continue to perform their intended function over elastic strains of 20% or more.

More preferably, stretchable electronic elements continue to perform their intended function over elastic strains of 15% or more. More preferably, stretchable electronic elements continue to perform their intended function over elastic strains of 10% or more. Still more preferably, stretchable electronic elements continue to perform their intended function over elastic strains of 5% or more. Soft electronic component may include stretchable sensors, cable connectors, energy harvesters and circuit elements.

As used herein the terms sense relates broadly to an ability to provide a characteristic which depends on, for example stretch and is not limited to requiring logical and or Boolean outputs.

One aspect of the present invention provides an assembly comprising a first electronic component connected to a second electronic component, wherein the first electronic component is stretchable, the device further comprising:
  a stretch-resistant element affixed to the stretchable first electronic component to provide a non-stretchable region for the one or more terminals of the first electronic component;
  one or more contact elements formed of conductive material, each located between the terminals on the first electronic component and respective terminals of the second electronic component; and
  a bias mechanism arranged to bias the first and second electronic components together, wherein each of the one or more contact elements are compressible between terminals to electrically connect the terminals of the first electronic component to terminals of the second electronic component.

A contact element may comprise a compliant conductive material.

A contact element may be provided on the first component.

A contact element may be a deposited dot of material on a terminal of the first electronic component.

The compliant conductive material may be resilient to facilitate the conduction element being secured between contacts under compression.

The compressible conductive material may be elastic material.

The elastic material may be suitable to yield under compression or strain but retain a constant volume.

The bias mechanism may be operable to apply a force to the non-stretchable region.

The bias mechanism may be operable to apply a compressing force to the stretch-resistant element.

The stretch-resistant element may be rigid to allow it to receive a force from the biasing mechanism at one or more points and to transmit the force to other points to allow a contact element located at said other points to be compressed.

The biasing mechanism may comprise a spring. The spring may be a leaf spring.

The biasing mechanism may comprise a tension element operable to transfer force from the spring to the second electronic component to anchor the spring in a compressed state to provide a biasing force for the first electronic component towards the second electronic component to compress the one or more contact elements.

The second electronic component may comprise a circuit board.

The circuit board may be rigid.

The circuit board may have an anchor feature for the tension element.

The tension element may be a pin.

The anchor feature may be an aperture formed in the second electronic component.

The device may comprise an over-moulded layer of material extending over the non-stretchable region of the device.

The over-moulded layer may comprise a compliant material.

The over-moulded layer may comprise elastic material.

The over-moulded layer may substantially cover one or more of the first and second electronic components.

Aspects of the present invention provide a process of interconnection of a contact of a first stretchable electronic component and a contact of a second electronics component, the method comprising the steps of:
  affixing a stretch-resistant sheet to a region of the stretchable electronic component which contains the contacts to be connected;
  providing soft conductive elements between the contacts of the stretchable component and contacts of a second electronics component; and providing a low-profile bias element to force the contacts of the first and second electronics components together to be connected electrically by the soft conductive element.

The first soft electronics component may comprise soft electronic electrodes affixed to a stretchable substrate.

The stretchable substrate may be a fabric.

Another aspect of the present invention provides an interconnection assembly operable to provide connection between one or more contacts on a first electronic component and respective one or more contacts on a second electronic component, wherein the first electronic component is stretchable, the interconnection connection comprising:
  a stretch-resistant element affixed to the first electronic component so as to provide a non-stretchable region for the one of more of the one or more contacts of the first electronic component; and
  one or more contact elements formed of conductive material and located between respective terminals on the first and second electronic components; and
  a bias mechanism arranged to compress the one or more contact elements between the respective terminals of the first and second electronic components.

The connection may be for a first electronic component which is stretchable and a second electronic component which is non-stretchable.

The connection may be for a first electronic component which is stretchable and a second electronic component which is rigid.

The connection may be for a first electronic component which is stretchable and a second electronic component which is stretchable, wherein the connection further comprises a second stretch-resistant element affixed to the second electronic component.

The contact element may comprise a piece of elastic material.

The contact element may be compressible over a compression tolerance.

The contact element may be formed of an elastic material.

The contact element may comprise a piece of elastomer.

The contact element may be operable to bias the respective contacts apart.

The contact element may be formed of a material with a selected Youngs modulus.

The bias mechanism may comprise a bias element.

The bias element may comprise a spring.

The spring may be a leaf spring. This may provide a low-profile device operable to provide the compression force.

The bias mechanism may comprise a tension element arranged to transfer force between the bias element and the second electronic component.

The bias mechanism may comprise a tension element arranged to engage the bias element and a plate located on the distal side of the second soft electronic component from the bias element.

The interconnection may comprise a soft over-moulded layer of material on one or both of the first and second electronic components.

The interconnection may be operable to connect a stretchable soft electronic component comprises one or more contacts located proximate an aperture formed in the soft electronic component.

The interconnection may be operable to connect a stretchable soft electronic component affixed to a stretchable substrate wherein the soft electronic component comprises one or more contacts located proximate an aperture formed in the substrate.

The first electronic component may comprise one or more sensors bonded to a fabric.

The first electronic component may comprise a smart fabric.

The first electronic component may comprise one or more soft electronic capacitors.

The first electronic component may comprise one or more soft electronic sensors.

The first electronic component may comprise one or more soft electronic actuators.

The first electronic component may comprise one or more soft electronic generators.

Another aspect of the present invention provides a process for manufacturing a device comprising a first electronic component connected to a second electronic component, wherein the first electronic component stretchable, the process comprising the steps of:
- affixing a stretch-resistant element to the first electronic component so as to provide a non-stretchable region for the one of more of the one or more contacts provided on the first soft electronic component;
- providing one or more contact elements formed of conductive material;
- locating the one or more contact elements between respective contacts on the first and second electronic components; and
- providing a bias mechanism arranged to compress the one or more contact elements between respective contacts provided on the first and second electronic components.

Another aspect of the present invention provides a process for connecting a first electronic component to a second electronic component, wherein the first electronic component is stretchable, the process comprising the steps of:
- affixing a stretch-resistant element to the first electronic component so as to provide a non-stretchable region for the one of more of the one or more contacts provided on the first soft electronic component;
- providing one or more contact elements formed of conductive material;
- locating the one or more contact elements between respective contacts on the first and second electronic components; and
- providing a bias mechanism arranged to compress the one or more contact elements between respective contacts provided on the first and second electronic components.

One aspect of the present invention provides an assembly comprising a first electronic component connected to a second electronic component, wherein the first electronic component is deformable in use, the device further comprising:
- a deformation-resistant element affixed to the stretchable first electronic component to provide a non-deformable region for the one or more terminals of the first electronic component;
- one or more contact elements formed of conductive material, each located between the terminals on the first electronic component and respective terminals of the second electronic component; and
- a bias mechanism arranged to bias the first and second electronic components together, wherein each of the one or more contact elements are compressible between terminals to electrically connect the terminals of the first electronic component to terminals of the second electronic component.

Aspects of the present invention provide an interconnect between a substantially not-stretchable electronic component and stretchable electronic component formed of layers of elastic dielectric material and layers of elastic conductive material, the stretchable electronic device operable to stretch to change the geometry of layers of conductive material and layers of dielectric material consistently over repeated cycles of stretch to provide an electrical characteristic which changes consistently over repeated cycles of stretch, wherein the films of elastic dielectric material and layers of conductive elastic material may comprise a matrix material in common with additives to impart conductivity for the conductive elastic material. The use of a matrix material in common may minimise any difference in stretch which might otherwise cause delamination of the stretchable electronic component and/or the stretchable electronic component from the non-stretchable component. The use of a matrix material in common may facilitate chemical bonding of the layers of elastic dielectric material and layers of elastic conductive material.

Other aspects of the invention may reside in any combination of the features of the paragraphs above.

As used herein the term 'compression' is intended to be interpreted broadly as complying under a compressing force and is not limited to elements which change volume under pressure.

As used herein the term 'compressible' is intended to be interpreted broadly as flattened by pressure.

As used herein the term 'electronic component' is intended to be interpreted broadly to include any electronic component and includes circuit boards, sensors, generators, and actuators.

As used herein the terms 'electrode' and 'terminal' is intended to refer broadly to a point by which an electric current enters or leaves an electronic component or electrical device.

BRIEF DESCRIPTION OF THE DRAWINGS

Additional and further aspects of the present invention will be apparent to the reader from the following description of embodiments, given in by way of example only, with reference to the accompanying drawings in which:

FIGS. 12 (a)-(c) show a flexible conductive wire deposited to a stretchable substrate and attached to a circuit board.

FIG. 13 shows a sample section of stretchable substrate 160 of a kind suitable for accepting deposited stretchable wires. The sample shown is 12 cm square of 3M premasking tape.

FIG. 14 shows the substrate subject to corona treatment to activate or modify the surface properties.

Further aspects of the invention will become apparent from the following description of the invention which is given by way of example only of particular embodiments.

Figure 35:
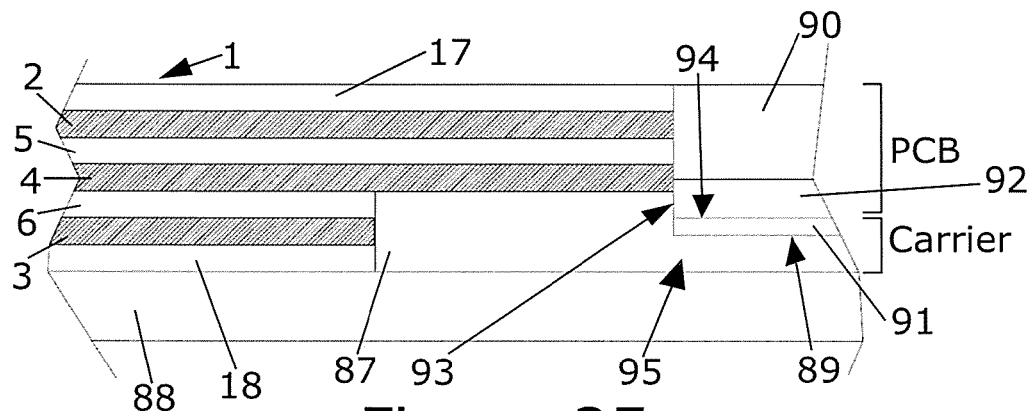
Figure 36:
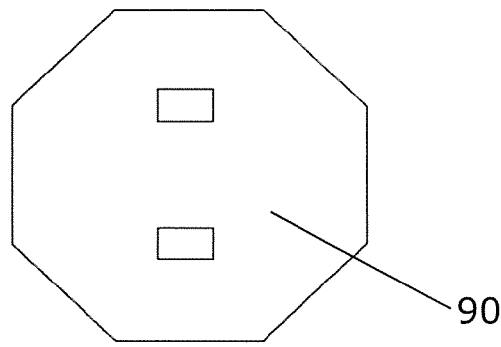
Figure 36:
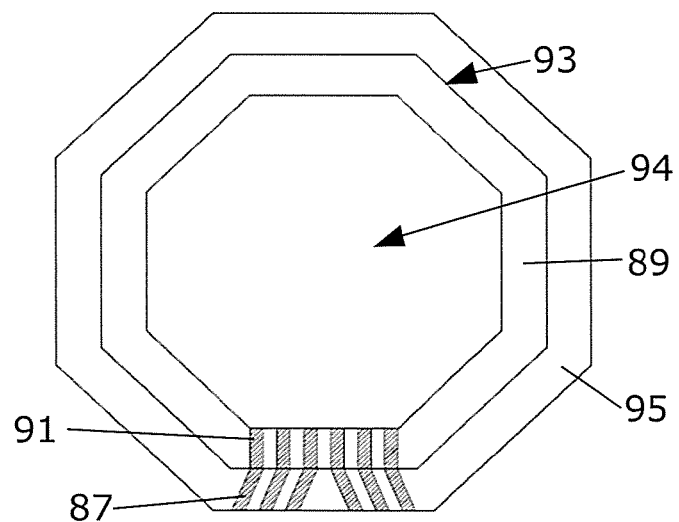
Figure 37:
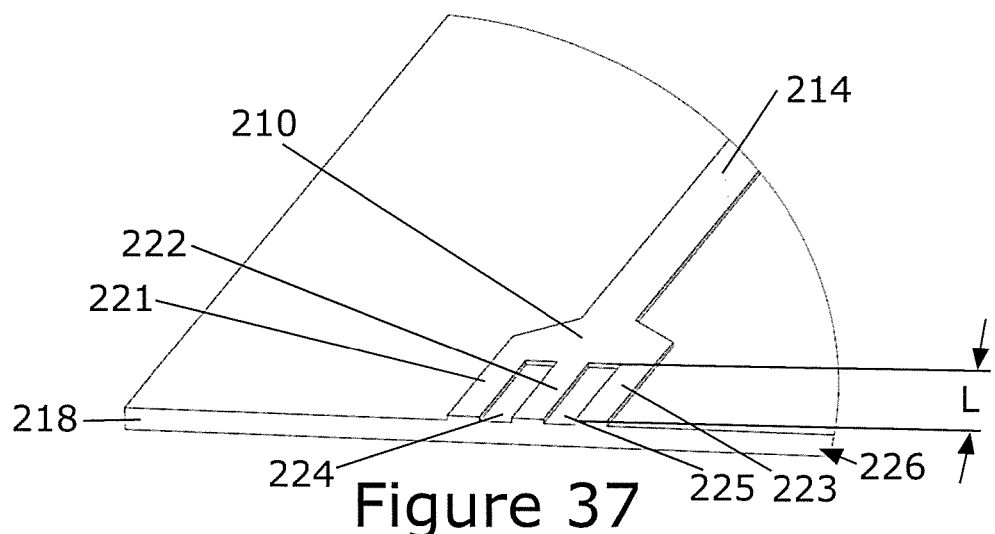
Figure 38:
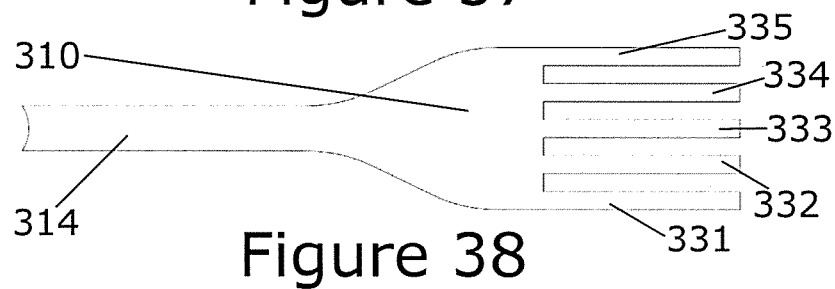
Figure 39:
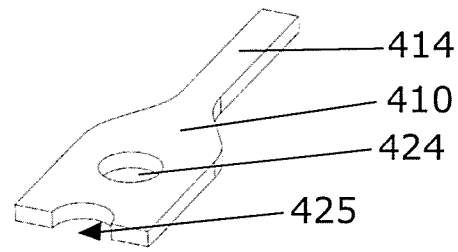
Figure 40:
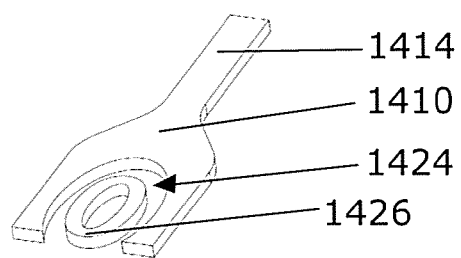
Figure 41:
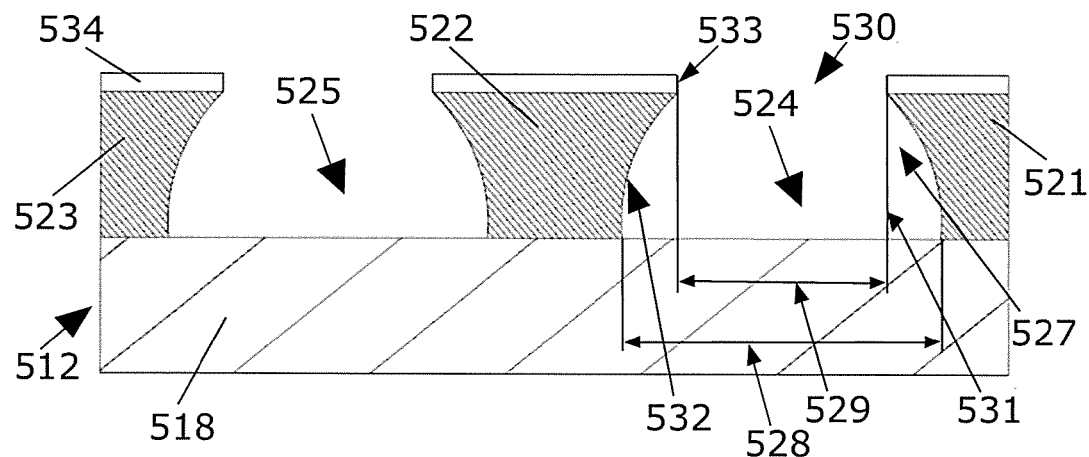
Figure 42:
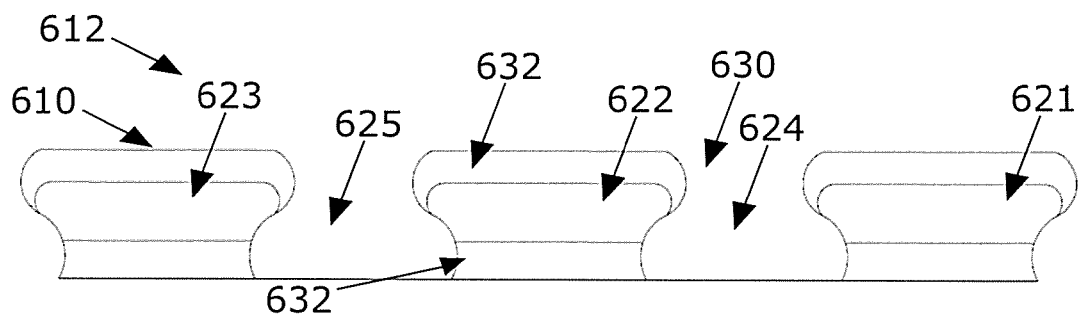
Figure 43:
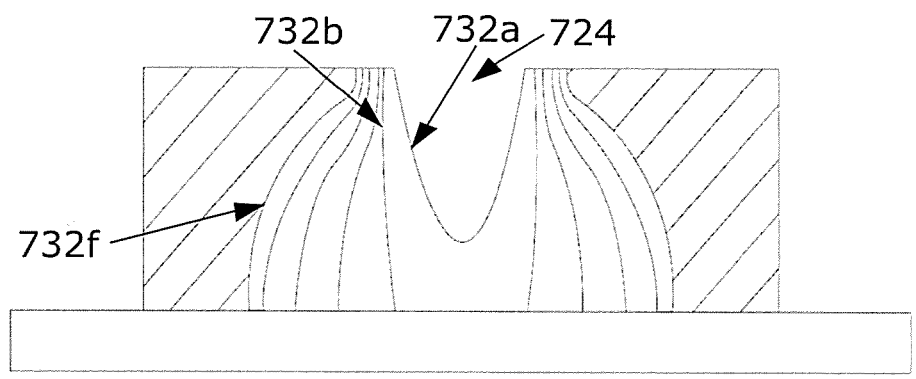
Figure 44:
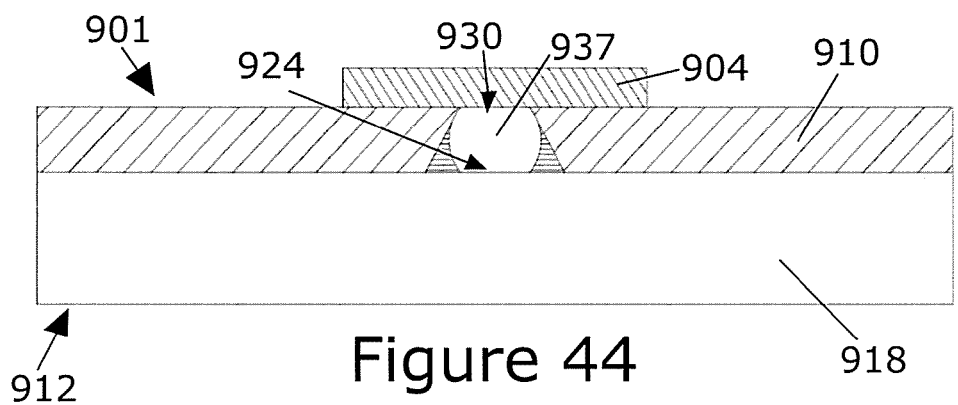
Figure 45:
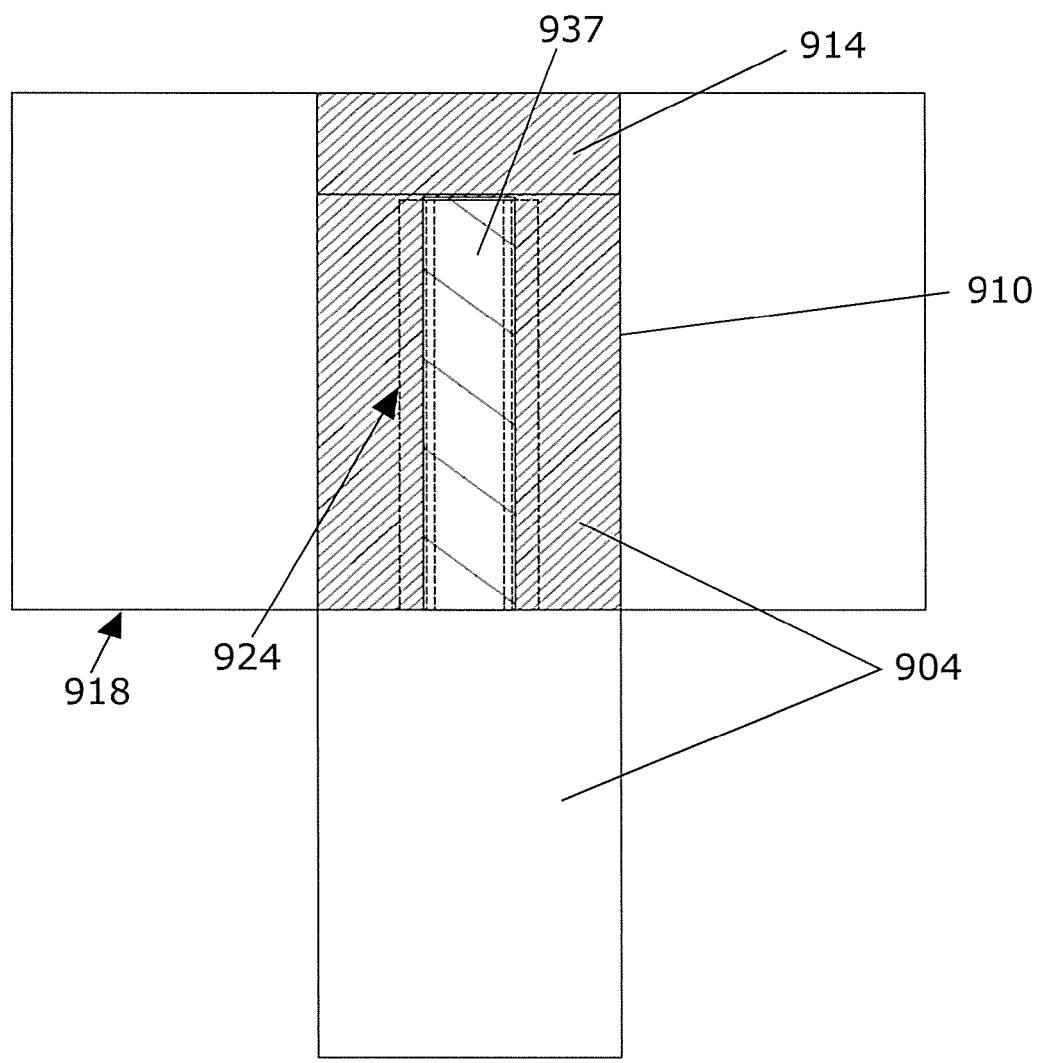
Figure 46:
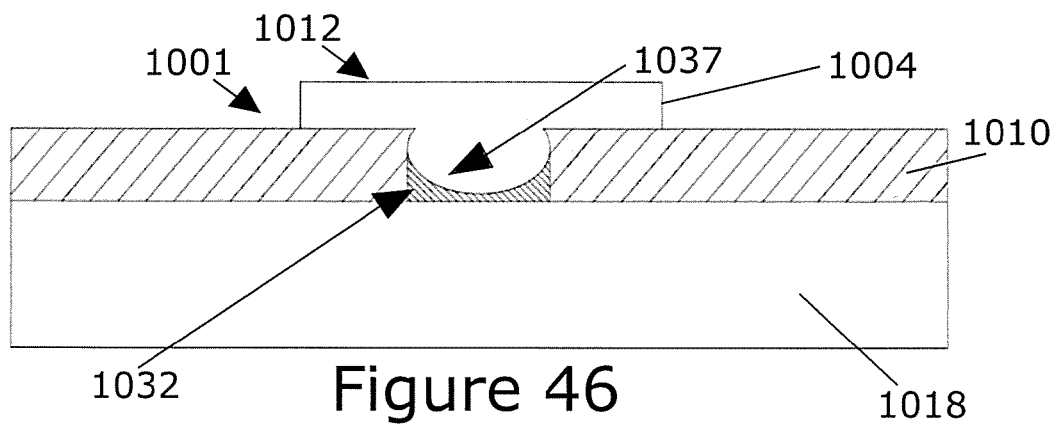
Figure 47:
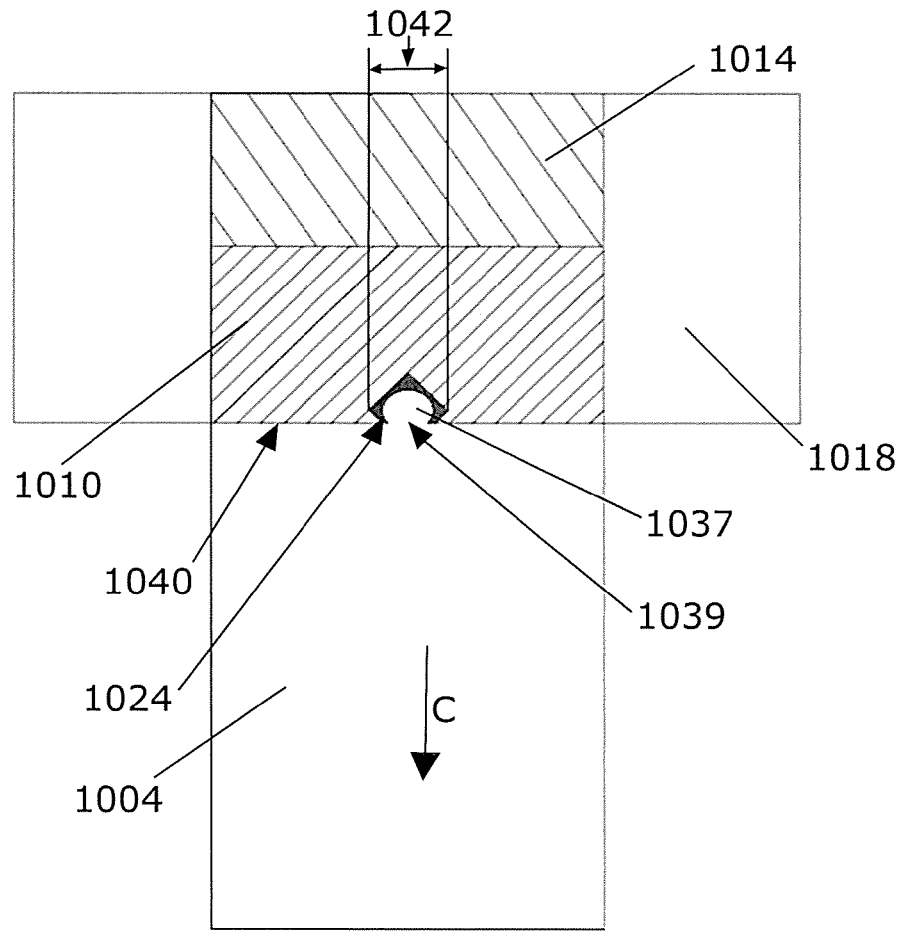
Figure 48:
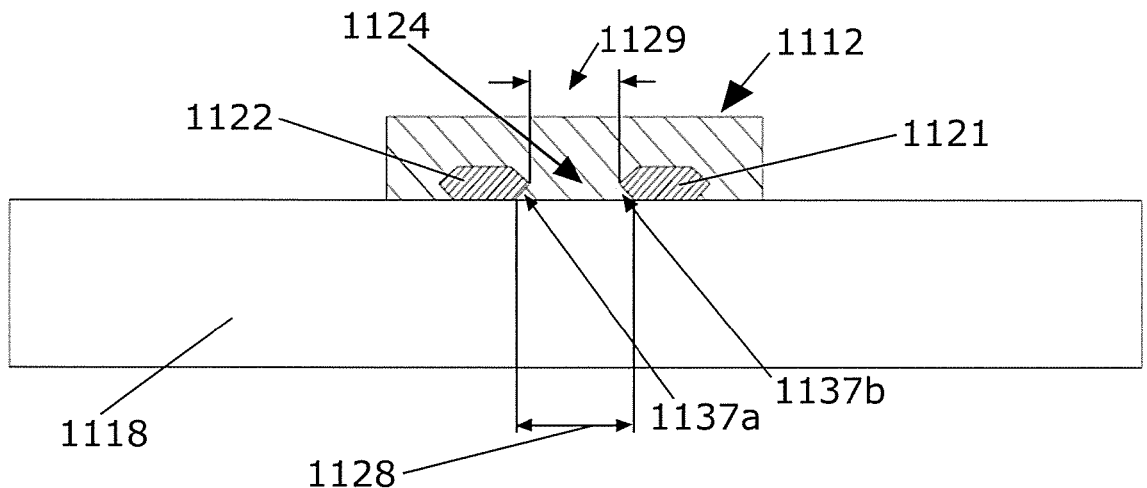
Figure 49:
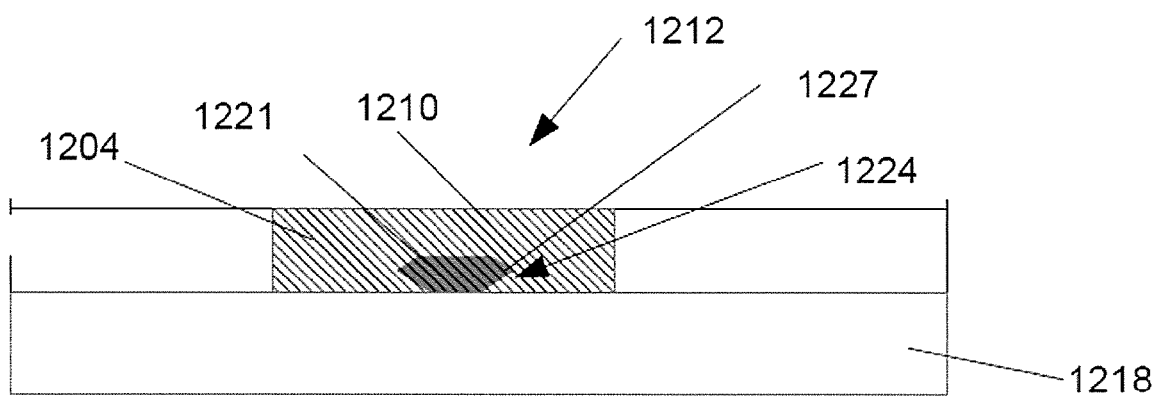
Figure 50:
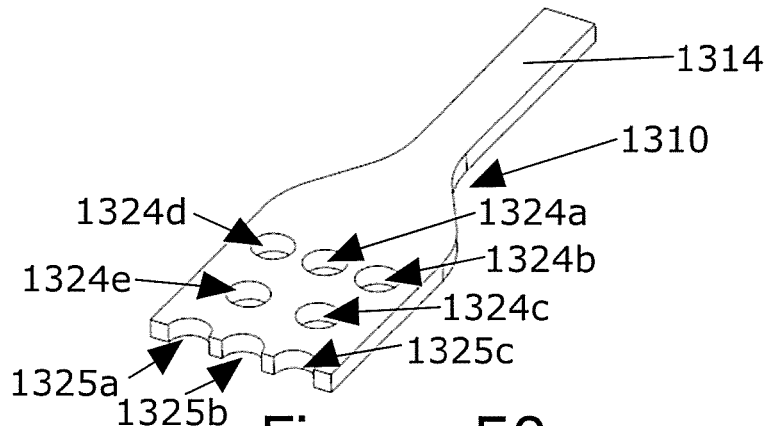
Figure 51:
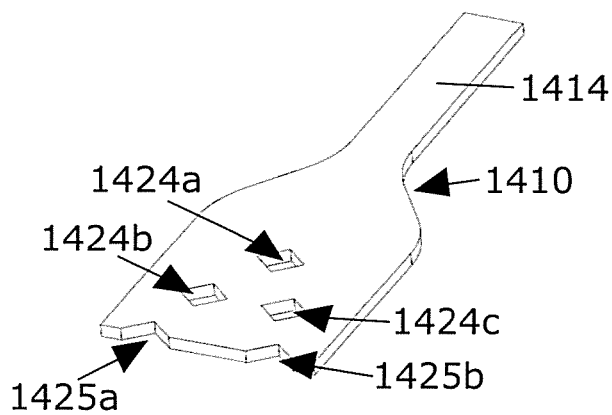
Figure 52:
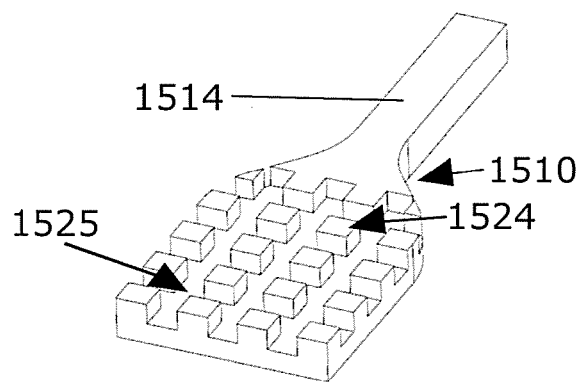

FIG. 35 shows a cut-away side elevation of a soft component with integrated connector according to an alternative embodiment of the present invention;

FIG. 36 shows a plan view of an interconnect for a soft component and rigid electronic circuitry according to the same embodiment as FIG. 35;

FIG. 37 shows perspective view of the interconnect of the same embodiment as FIG. 36;

FIG. 38 shows a plan view of a contact of an interconnect of an alternate embodiment as FIGS. 36 and 37;

FIG. 39 shows a perspective of a contact of an interconnect according to an alternative embodiment to that of FIG. 38;

FIG. 40 shows a perspective view of a contact of an interconnect according to a further alternative embodiment of the present invention;

FIG. 41 shows a cut-away elevation of an interconnect according to a further embodiment of the invention;

FIG. 42 depicts an image of an interconnect according to a further embodiment of the invention;

FIG. 43 illustrates development over time of cavities by etching according to a further embodiment of the present invention;

FIG. 44 shows a cut-away elevation of a soft component with integrated connector according to another embodiment of the present invention;

FIG. 45 shows a plan of a soft component with integrated connector according to the embodiment of FIG. 44;

FIG. 46 shows a cut-away elevation of a soft component with integrated connector according to a further embodiment of the present invention;

FIG. 47 shows a plan of a soft component with integrated connector according to the embodiment of FIG. 46;

FIG. 48 shows a cut-away elevation of a soft component with integrated connector according to an additional embodiment of the present invention;

FIG. 49 shows a cut-away elevation a soft component with integrated connector according to another embodiment of the present invention;

FIG. 50 shows a perspective of a contact of an interconnect according to an alternative embodiment to that of FIGS. 38, 39 and 40;

FIG. 51 shows a perspective of a contact of an interconnect according to an alternative embodiment to that of FIGS. 38, 39, 40 and 50; and FIG. 52 shows a perspective of a contact of an interconnect according to an alternative embodiment to that of FIGS. 38,39, 40, 50 and 51.

Figure 53:
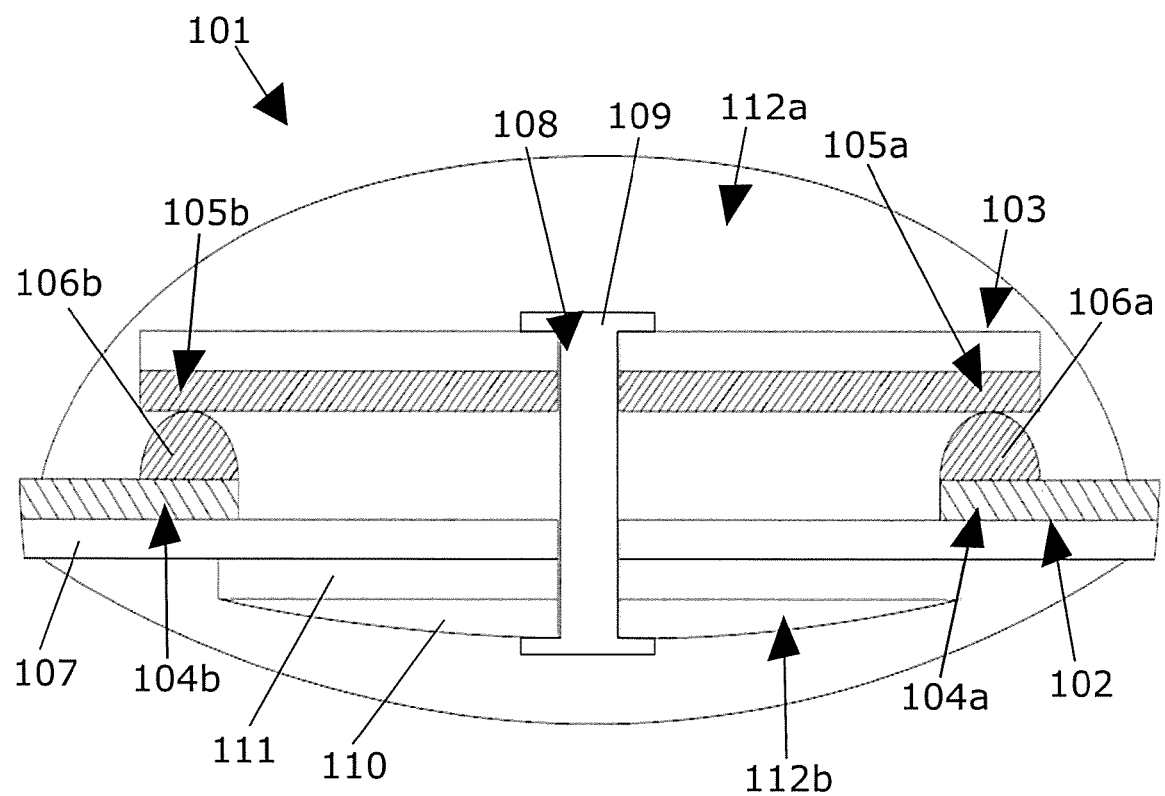

FIG. 53 gives the cutaway side-elevation of a device according to a preferred embodiment of the present invention.

Further aspects of the invention will become apparent from the following description of the invention which is given by way of example only of particular embodiments.

DETAILED DESCRIPTION

Embodiments of the present invention relate to the robust electrical interconnection between a stretchable electronic element and a flexible or rigid circuit board, where the stretchable electronic element comprises a stretchable sensor, stretchable cable, stretchable connector, stretchable circuit element, or stretchable energy harvesting component. A challenge exists in maintaining a robust electrical interconnection due to the large difference in stretchability between such a stretchable electronic element and a flexible or rigid circuit board (PCB or PCBA).

For the purpose of this detailed description the example of a stretchable capacitive sensor mechanically coupled to a stretchable substrate will be used as an exemplar for this challenge and the resolution provided by the present invention, however any other stretchable electronic component requiring one or more interconnects with a second electronic component may be substituted in the description without deviating from the scope of the present invention.

A capacitive sensor is a type of sensor which produces measurable changes in capacitance to indicate one or more changes in environmental characteristics.

Exemplars of embodiments of the present invention are encapsulated in sensing or measurement of the deformation of a stretchable substrate by changes in capacitance through deformation of a stretchable capacitive sensor mechanically coupled to the stretchable substrate.

A stretchable capacitive sensor is often formed as a series of films of elastomeric or at least flexible material. The series of films can be patterned and deposited individually and assembled, or formed sequentially in place using several methods. A stretchable capacitive sensor component may comprise thin dielectric layers formed of elastic material and thin conductive layers formed of stretchable electrically conductive material. Terminals for electrical connection to the capacitive sensor are required to make it operable and are formed by the appropriate design and assembly of the films of material.

A sensor typically comprises a plurality of layers. A layer of a sensor may be manufactured by a casting process. The casting process uses a cast into which a material to be deposited is applied. The casting process is used to apply a layer of conductive material in a defined pattern. The casing process may use casts as pattern elements, which define patterns. The resulting product of the casting process is a layer of the sensor defined by a cast.

Figure 1:
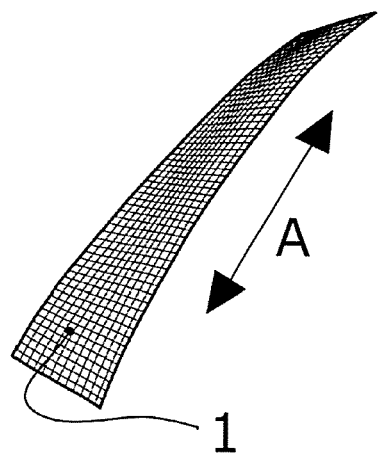
FIG. 1 shows a general form of an example capacitive sensor which is deformable to produce measurable changes in electrical characteristics.

FIG. 1 shows an illustrative soft electronics component 1. In this example, the soft electronics component is a capacitive sensor. The capacitive sensor 1 has a capacitance which changes with the geometry of the sensor as it is deformed, by stretch or compression for example. Measuring the capacitance of the sensor 1 allows deformation to be sensed and/or detected and/or measured and/or instrumented or allows a state of configuration, such as elongation for example, to be determined. In this example the capacitive sensor 1 is a stretch sensor and the deformation to be measured is stretch in a material, or smart fabric, onto which the capacitive sensor is bonded. The capacitive stretch sensor 1 is elongate and intended to measure stretch predominantly in direction D.

Figure 2:
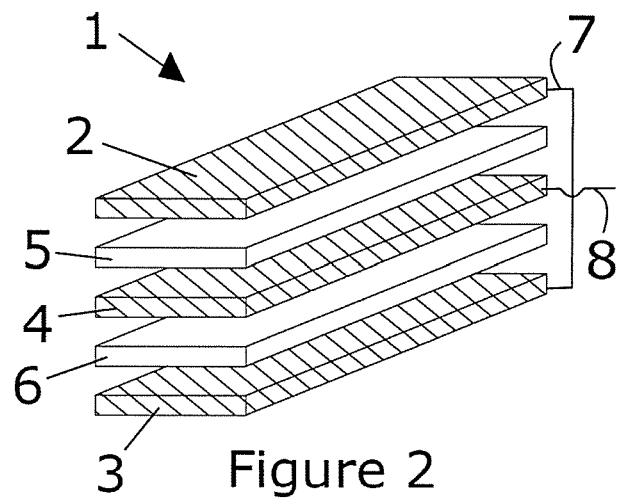
FIG. 2 shows an exploded view of a stretchable capacitive sensor.

FIG. 2 shows an exploded view of the capacitive sensor 1. The sensor has outer electrodes 2 and 3 and an inner electrode 4 formed of a conductive material. In this example the conductive material is silicone with a dispersion of carbon particles. The reader will appreciate that it may be difficult or impossible to achieve a homogenous and/or consistent resistivity over a length of such conductive material. It may be particularly difficult or impossible to achieve consistency in the resistivity of such conductive material as the material is stretched. In this example the conductive material of the electrodes 2, 3 and 4 has a resistivity in the order of 0.1 to 5 Ohms/cm, although the reader will understand that this will change as the material is stretched. The reader will also understand that the change in resistivity is likely to change in a non-linear relationship to stretch. In other examples, the resistivity may be in the order of 10^6 Ohms per cm.

As shown in FIGS. 1 and 2, the inner electrode 4 is separated from the outer electrodes 2 and 3 by dielectric layers, or dielectrics, 5 and 6. The outer electrodes 2 and 3 are connected in common to an outer electrode terminal 7 and the inner electrode is connected to an inner electrode terminal, or signal terminal, 8. The dielectrics 5 and 6 separate the outer electrodes 2 and 3 from the inner electrode 4 to provide a capacitance measurable across terminals 7 and 8. As the reader will appreciate a change in geometry of the capacitive sensor 1 will change the geometry of the electrodes 2, 3 and 4 and will change the capacitance of the sensor 1. For example, the overlapping area of the outer electrodes 2 and 3 with respect to the inner electrode 4 may change resulting in a changed capacitance. Also for example if the separation of the outer electrodes 2 and 3 from the inner electrode 4 is changed the capacitance will change also. As the reader will appreciate various types of measurements may be made by measuring capacitance of the capacitive sensor 1. To name one example, a capacitive sensor 1 may have a calibrated capacitive characteristic which allows a length or degree of stretch or other deformed state of the capacitive sensor 1 to be measured by measuring capacitance of the sensor. Also for example capacitance may be measured at different times to calculate a change in capacitance to sense the occurrence of deformation or degree of stretch.

As the reader will appreciate the measurement of deformation may depend in some applications on a model or calibration of a sensor in an initial state, such as in a resting state. The measurement may also depend on a model or calibration data on the change in electrical characteristic with degree of stretch.

The capacitance of a capacitive sensor, such as shown in FIG. 1 and FIG. 2 can be expressed as:

$$C = 2 \cdot \frac{\epsilon_0 \cdot \epsilon_r \cdot A}{t} \qquad \text{Equation 1}$$

where C is the capacitance, A is the electrode area and t is the thickness of the dielectric material which separates the electrodes, ε0 is the permittivity of a vacuum, and Er is the relative permittivity of dielectric material in the layers 5 and 6.

In the case of an elongate sensor 1 which is stretched in the elongate direction the capacitance may be approximated using Equation 1 by an assumption that the electrode area is represented by a length multiplied by a width.

Some embodiments are formed using casting to manufacture a layer of a soft electronic component. The casting of some embodiments uses a cast into which a material to be deposited is applied. In some embodiments the casting is used to apply a layer of conductive material in a defined pattern. The casing may use casts as pattern elements, which define patterns. The resulting product of some embodiments has a layer of the soft electronic component defined by a cast. Some embodiments have a cast layer.

Some sensors are manufactured by steps in a process which uses a stencil to deposit a layer of an integrated sensor and/or a pattern of signal electrodes and cable conductors. The steps of the stenciling process utilizes stencils as pattern elements, which define patterns for layers and/or a pattern of sensors.

Some sensors are created by screen printing a layer of an integrated sensor and/or a pattern of signal electrodes and cable conductors. The printing uses screens as pattern elements, which define patterns for layers and/or a pattern of sensors.

Some sensors are created by a digital printing to deposit a layer of an integrated sensor and/or a pattern of signal electrodes and cable conductors. The printing uses computer controlled dispensing heads as pattern elements, which define patterns for layers and/or a pattern of sensors.

Some sensors are created by flexography printing to deposit a layer of a sensor and/or a pattern of signal electrodes and cable conductors. The printing uses raised surfaces on planar or rotary tools as pattern elements, which define patterns for layers and/or a
pattern of sensors.

Some sensors are created by a process which uses gravure to deposit a layer of a sensor and/or a pattern of signal electrodes and cable conductors. The printing uses embossed patterns on rotary tools as pattern elements, which define patterns for layers and/or a
pattern of sensors.

Some sensors are created by an offset lithography process which deposits a layer of an integrated sensor and/or a pattern of signal electrodes and cable conductors. The printing uses a series of rollers to transfer liquids to a substrate in patterns defined to
describe a pattern of layers and/or a pattern of sensors.

Some embodiments are formed using spray deposition, implantation or injection of materials.

Some sensors are created by a process which uses lamination to deposit a prefabricated layer of an integrated sensor and/or a pattern of signal electrodes and cable conductors. The lamination uses prefabricated patterned layers, which define patterns for layers
and/or a pattern of sensors and/or cables.

The region of conductive material providing interfaces onto which an interconnection element is formed, for example, by the pattern or design of the conductive material, by corona/plasma treatment or by chemical etching of a layer of conductive material using lithography to promote bonding to the PCB conductive tracks, or by depositing conductive material in a pattern over the interconnection element to create a bump. Some stretchable capacitive sensors have overlapping electrodes which provide a capacitance which varies when the layers are stretched and/or compressed. The capacitance varies when the layers are stretched and/or compressed in a range which is selected for given sensing and/or measuring circuits.

Some stretchable capacitive sensors are formed, at least in part, by conductive elastic layers formed of elastic material which is impregnated or doped with conductive materials such graphite, carbon, nanotubes, copper or silver. Other stretchable capacitive sensors comprise conductive elastic layers formed of elastic material which is impregnated or doped with any suitable material or compound known to the reader to cause the material to act as a conductor and/or act as an electrode of a capacitor. Stretchable capacitive sensors may be connected together by an interconnection component that is formed of a flexible or rigid PCB. One or more stretchable capacitive sensors may be connected to a PCB comprising a circuit that may be operable to measure the capacitance of the sensor for example that is made possible by the interconnection between the electrically conductive layers of the sensor and certain electrically conductive pathways on the PCB. In some embodiments, the capacitive sensors comprise a stretchable wire extending from the sensor to and operable to connect the sensor to other electrical components, such as a flexible or rigid PCB. Particular embodiments of the invention relate to connection interfaces between a capacitive sensor or stretchable wire and a flexible or rigid PCB.

To date, it is difficult to connect flexible or rigid PCB to a stretchable fabric upon which a stretchable capacitive sensor is formed. The prior art has shown rigid printed circuit boards (PCB) or flexible printed circuit (FPC) can be connected to a stretchable capacitive sensor on a stretchable substrate using a bulky clamped structure which requires a portion of the substrate to which the sensors are attached to be completely demobilized to prevent relative movement. Some applications of the capacitive sensors relate to wearable technology, therefore requiring the sensors and interconnecting components are as inconspicuous as possible.

Figure 3:
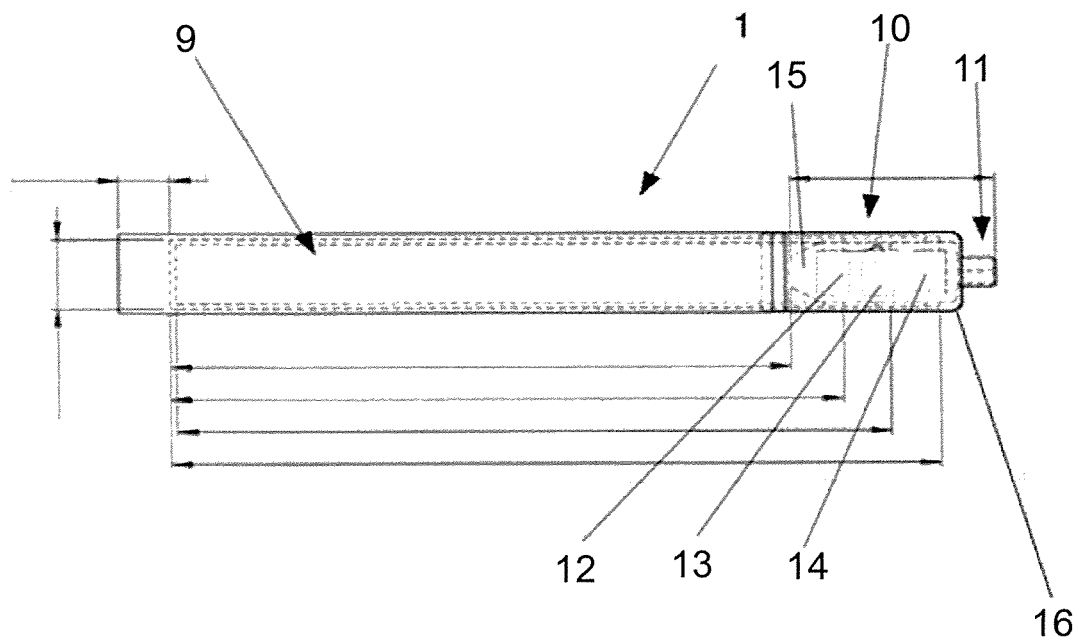
FIG. 3 shows an exemplary embodiment of a sensor which is deformable to provide a measurable change in capacitance

FIG. 3 shows an exemplary embodiment of a sensor 1 which is deformable to provide
a measurable change in capacitance. Measuring the degree of deformation allows instrumenting of deformation of a body or object, for example, to which the sensor is mechanically coupled. In the example depicted, the sensor comprises a stretchable laminate structure having some layers which act as electrodes of a capacitor and other layers which act as dielectrics of a capacitor. The laminate structure has a capacitance which varies as the laminate is stretched.

The sensor 1 comprises three main components: a stretchable sensor component 9, a circuit board 10 incorporating a terminal 11. The circuit board 3 which electrically couples the electrode layers of the stretchable sensor component 9 to the terminal 11 connection. The terminal connection provides a physical interface for electrical coupling connection which may in turn connect to a proximate or remotely located sensing circuit (not shown) for ultimate measurement of the electrical characteristic of the stretchable sensing component 9. In alternative embodiments an electronic circuit may be incorporated directly onto the circuit board.

The circuit board 10 has a first sensor interface 12 to interface with an electrode layer of the sensor component 9. The interface 12 is a region of conductive material formed on a substrate of material. In this example, the conductive material of sensor interface 12 is copper and the substrate is a polyamide tape.

The circuit board 10 also has a second sensor interface 13, also formed of a region of conductive material formed on a substrate of material. The second sensor interface 6 of this particular embodiment is located relatively distal from a region where the sensor component 9 stretches in use compared to the first sensor interface 12. The circuit board 10 shown in FIG. 3 also has a third sensor interface 14 which is located relatively more distal from the region in which the sensor component 9 stretches.

FIG. 3 shows a tapered region 15 of the circuit board 10, tapering towards the main part of the sensor component 9. In this particular embodiment this taper serves three functions:

The first function is that the circuit board 10 has less material towards the end of the taper and therefore is more flexible towards the end of the taper. This graduates strain occurring in the sensing component 9 as it is stretched.

The second function is a line of contact between the sense component 9 and the circuit board 10 in the plane of the circuit board 10 is increased.

A third function is that the interface between the sensor component 9 and the circuit board 10 in the plane of the circuit board 10 has components which are at a range of angles to a direction of stretch in which the sensor component 9 is elongated to accommodate.

Figure 4:
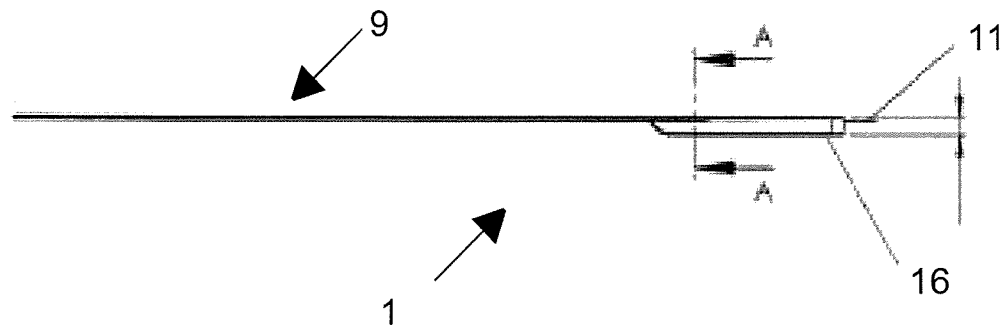
FIG. 4 shows a side view of the stretchable sensor.
Figure 5:
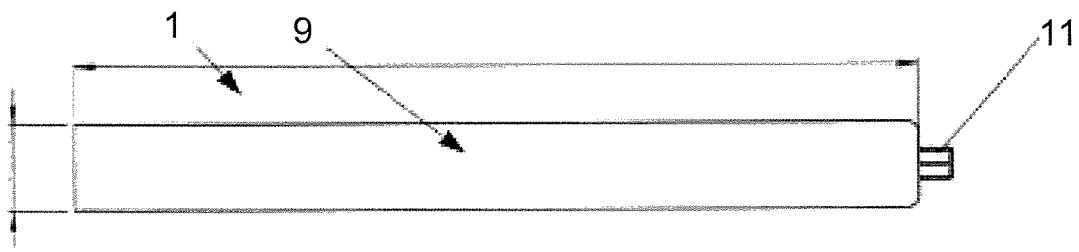
FIG. 5 gives a view of the underside of the stretchable sensor.

FIG. 4 shows a side view of the stretchable sensor 1 and FIG. 5 gives a view of the underside of the stretchable sensor 1. As visible in FIG. 2 the circuit board 10 in this example is thicker than the stretchable sensor component 9 due to an over mould 16 material which seals the interfaces 12, 13 and 14 against the ingress of water for example. This over mould 16 allows the sensor 1 to be washable. The thickness of the over mould tapers from a maximal thickness where it overlaps with the circuit board 10 to no thickness a short distance from the edge of the circuit board 10 in the direction of the main body of the sensor component 9. Preferably the gradient of this taper is not less than 0.1 mm per mm. This tapered thickness of the over mould 16 creates a distribution of stiffness positively correlated with the thickness of the over mould 16. Thus when the stretchable substrate and the sensor component 9 mechanically coupled to it are stretched the local strain decreases as the thickness of the over mould 16 increases, reducing the strain differential between the sensor component 9 and the circuit board 10 at the edge of the circuit board 10 to prevent mechanical failure at the interconnection region.

Figure 6:
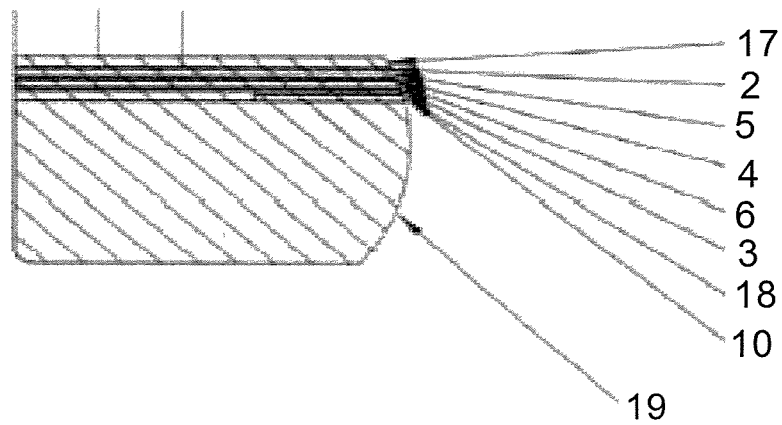
FIG. 6 shows a cross section is taken at section line A-A of FIG. 4.

FIG. 6 shows a cross section is taken at section line A-A of FIG. 2. As shown in FIG. 4 at the circuit board 10 layers of stretchable dielectric material 10, 5, 6 and 18 are arranged into sandwich layers of stretchable conductive material 2, 3, and 4. In this example the layer of stretchable conductive material layer 13 provides a signal electrode for the stretch sensor 1 and stretchable conductive material layer 2 and 3 provide electrical grounding, and also shielding, electrodes. A capacitance formed between the conductive layer 4 and the conductive layers 2 and 3. As the reader will appreciate, the capacitance changes as the stretch sensor component 9 is stretched. As the reader will be aware this change in capacitance occurs due to a change in the overlapping area of the electrodes 4 and electrodes 2 and 3 and also due to the electrodes becoming closer together by the elastic nature of the dielectric layers 5 and 6. Also shown in FIG. 6 is the circuit board 10 has an over-mould material 19 which encapsulates the circuit board 10 which provides mechanical protection and seals the component 10 from water for example.

Figure 7:
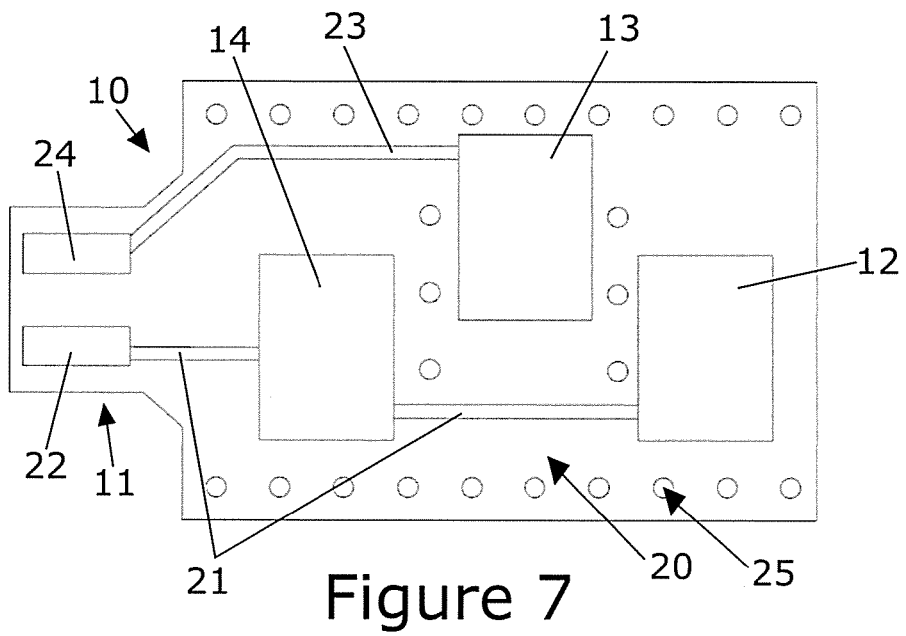
FIG. 7 shows the interconnection component 3 FIG. 3. connected by two terminals to an amplifier module which has an amplifier circuit.

FIG. 7 shows the circuit board 10 from FIG. 3, and in particular shows regions of conductive material providing interfaces 12, 13 and 14 formed on a thin sheet of flexible substrate material 20. On the opposite side of the substrate material 20 to the interfaces 12, 13 and 14 is formed a track 21 of conductive material which connects interfaces 12 and 14 to an electrical ground or shielding terminal 22. As shown, another track 23 of conductive material connects the interface region 13 to a signal terminal 24.

Also shown in FIG. 7 is a set of apertures 25 formed in the substrate material 20 of the interconnection component 10. The apertures 25 provide engagement features allowing elastic material, such as a layer of dielectric elastic material to fill the apertures to engage the substrate material 20 to mechanically engage the interconnection component 3.

The interfaces 12 and 14 are offset laterally with respect to interface 13. This serves the purpose of allowing separation of the track 21 from the track 23. It also serves the purpose of providing separation between electrode liquid used to form conductive layers of the sensor component 9, prior to setting or curing, from an interface region to which it will not be interfaced or connected. The apertures 24 of formed around the periphery of the substrate material 20 of the interconnection component 10 in rows transverse to the axis of the elongate interconnection element 10.

One exemplary application for the stretchable sensor component 9 is to attach it to a garment to allow instrumenting of a limb or other part of a human or animal body. The attachment may be created by an adhesive (not shown) which allows the component 9 to be heat-bonded to the garment. Another attachment method is to deposit the sensor directly to stretchable fabric or a garment. That is, some or all of the films of materials 21 that form the sensor component 9 may be deposited on the stretchable substrate to thereby construct an effective capacitor from the resulting layers.

The above described embodiment shows a unitary sensor where the sensing component 9 is interconnected to a terminal 11 by a circuit board 10. The unitary sensor may be attached to any desired substrate to be sensed. However, in some circumstances it is advantageous to construct a sensor component directly onto a stretchable substrate, such as a stretchable fabric for example, to produce a "smart" stretchable substrate. A smart stretchable substrate is typically constructed by mechanically coupling a stretchable sensor component onto the stretchable substrate, or by depositing elements that collectively form a stretchable sensor component directly onto a stretchable substrate. Such a smart substrate requires the electrode layers of a capacitor to be connected to other electrical components.

Therefore there is the desire to electrically couple at least the electrode layers to a flexible or rigid PCB where further electrical processing may take place. One problem associated with coupling the electrode layers to a circuit board is that the stretchable substrate upon which the stretchable capacitive sensor resides is typically deformable in multiple dimensions, whereas a PCB may be a flexible or rigid PCB, neither of which are stretchable. The direct connection of a deformable electrical conductor to a rigid conductor is known to lead to a compromised electrical connection. Those skilled in the art will appreciate that compromised connections is highly undesirable as it will typically lead to unreliable or inaccurate measurements or system failure.

Therefore the inventors propose three electrical embodiments which provide electrical coupling solutions are outlined in detail below. In each embodiment, it is desirable that there are stretchable wires extending from at least some the electrode layers of the capacitive sensor. The wires may be formed, for example, by depositing an electrical conductor (in much the same way the electrode was deposited) along a portion of the stretchable substrate layer.

Key considerations are that the connection to an electrode (or wires extending from an electrode) must be able to withstand strain forces between the smart stretchable substrate and a flexible or rigid PCB; and the connection must be electrically strong yet not physically weak enough to not damage the surrounding stretchable substrate, for example, by being substantially rigid. Further, it is desirable to have the connection as inconspicuous as one particular application is a sensor or many sensors to a garment to be worn, thereby necessitating considerations such as physical protection and strength to withstand the connection being manipulated mechanically during the typical use for a garment that is worn.

Figure 8:
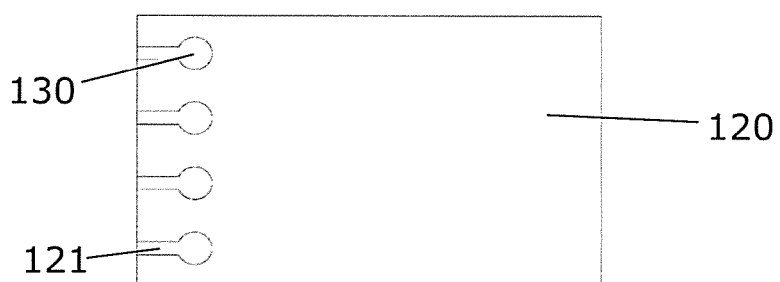
FIG. 8 illustrates a perspective view of a stretchable substrate such as a garment.

FIG. 8 illustrates a perspective view of a stretchable substrate such as a garment. One or more stretchable wires 121 are deposited to the substrate to form an electrically conductive pathway. Each stretchable wire is stretchable in that it conforms to the stretching and deformation of the substrate to which is it attached.

Figure 9:
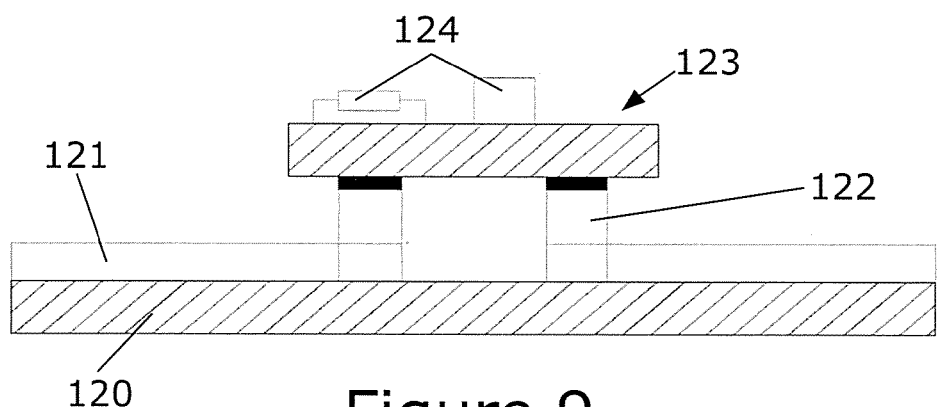
FIG. 9 shows an end cross sectional view of the substrate of FIG. 10.
Figure 10:
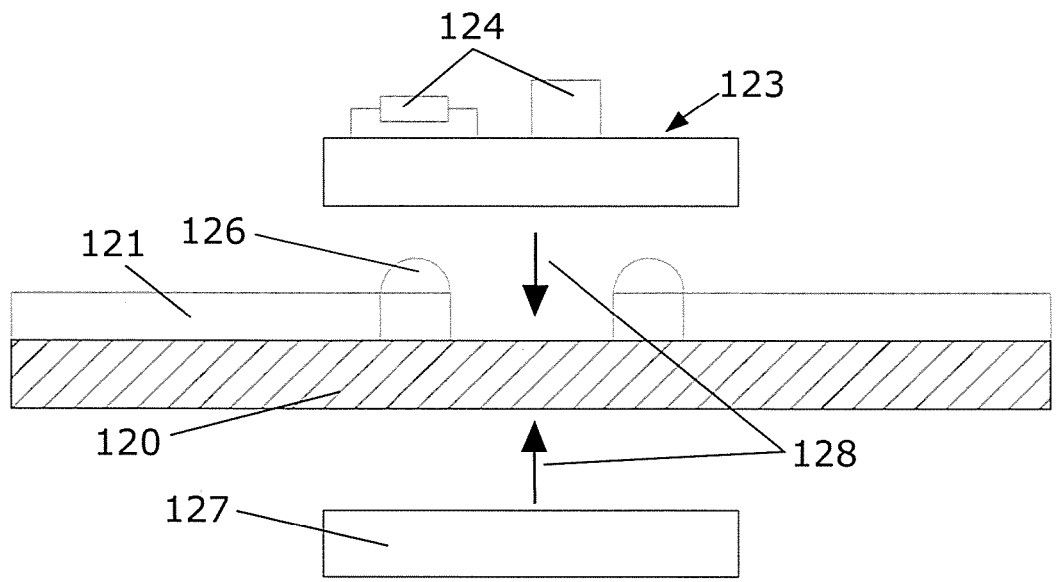
FIG. 10 shows a cross sectional view of a second embodiment of the invention where there resides an "insert" between the substrate and a circuit board.

FIG. 9 shows an end cross sectional view of the stretchable substrate 120 of FIG. 10 together with a rigid or flexible printed circuit board 123 shown positioned above the surface of the stretchable substrate 120.

The circuit board 123 may comprise electrical components 124 such as SMD devices and/or conductive tracks or wires that provide electrically conductive pathways that lead to other electrical devices, or may form an adaptor bridge between the stretchable wires and conductive terminals that may be connected to another PCB using conventional soldering techniques or standard circuit connectors. In particular, the circuit board has an electrically conductive landing pad or set of landing pads 122 on a lower surface thereof that are arranged to oppose the stretchable wires 121 of the stretchable substrate 120. Each pad 122 forms a conductive termination affixed to the circuit board 123 that contacts the surface of the stretchable wires 121 when correctly aligned. The pads may be enhanced, for example, by depositing layers of the substance used to form the stretchable wire 121 on the pads, or alternatively, may be a separate component such as an electrically conductive polymer that forms an electrical pathway from the surface of the stretchable wire 121 to the circuit board. Conductive polymers will be apparent to those skilled in the art and include silver or carbon loaded epoxies and silicones.

In use, the circuit board is positioned with the landing pads 125 opposing the stretchable wires 121 and brought into a contacting position by abutting conductive surfaces on the circuit board and stretchable wires 121 together. The circuit board may be attached and held to the stretchable substrate using any conventional method such as an adhesive. Preferably a bias pressure is applied to the assembly of the circuit board and stretchable wires on the stretchable substrate while the adhesive is cured, such that the interconnection area of the stretchable wires and/or the landing pads disposed between the circuit board and stretchable wires if present, are elastically deformed and provide an opposing pressure to the bias pressure. Once cured, the use of the adhesive means no clamping force between the substrate and circuit board are required. The abutting pads of the stretchable wires on the stretchable substrate and circuit board form an electrical connection by virtue of being in contact. The stretchable substrate may have a degree of deformation whilst maintaining that electrical connection, that is, an electrical contact is able to be maintained between the abutting pads despite relative movement between the substrate and PCBA.

FIG. 10 shows a cross sectional view of a second embodiment of the invention where there resides an "insert" between the substrate and a circuit board. In particular, FIG. 10 shows a deformable substrate 120 having conductive tracks or stretchable wires 121 attached thereto. Each stretchable wire terminates with a conductive polymer terminal or "bump" 126 extending vertically from the upper surface of the stretchable wire. In some varied embodiments the conductive polymer terminal is resiliently deformable. Such that the conductive polymer will deform under load to provide an electrical connection which is elastically biased into a connecting manner.

In use, as shown in FIG. 10, a circuit board is lowered toward the substrate such that electrical conductors on the circuit board come into contact with the conductive polymer terminal 126. The circuit board may be clamped to the substrate as indicated by arrows 128 which maintain a load on the conductive polymer terminals 126. Further, a support plate 127 may be provided beneath the substrate such that the clamping load is spread over a region of the substrate greater than the mere surface area provided by the terminal connection. In this way, a reliable electrical connection is maintained between the conductive polymer terminal and the circuit board despite any deformation the substrate may undergo. The support plate may be attached to the circuit board by clamping methods including rivets or similar interlocking elements that once engaged provide a mechanical force biasing the connection regions into a connected manner. However, these interlocking elements must be narrow enough to avoid increasing the size of the PCB and support and not damaging to proximate circuitry. Adhesives such as epoxy may also be used in combination with clamping methods to further improve the resilience of the connection.

The third embodiment provides advantages including that the raised conductive polymer 126 also provides more resilience to deformation than gluing directly down.

Figure 11:
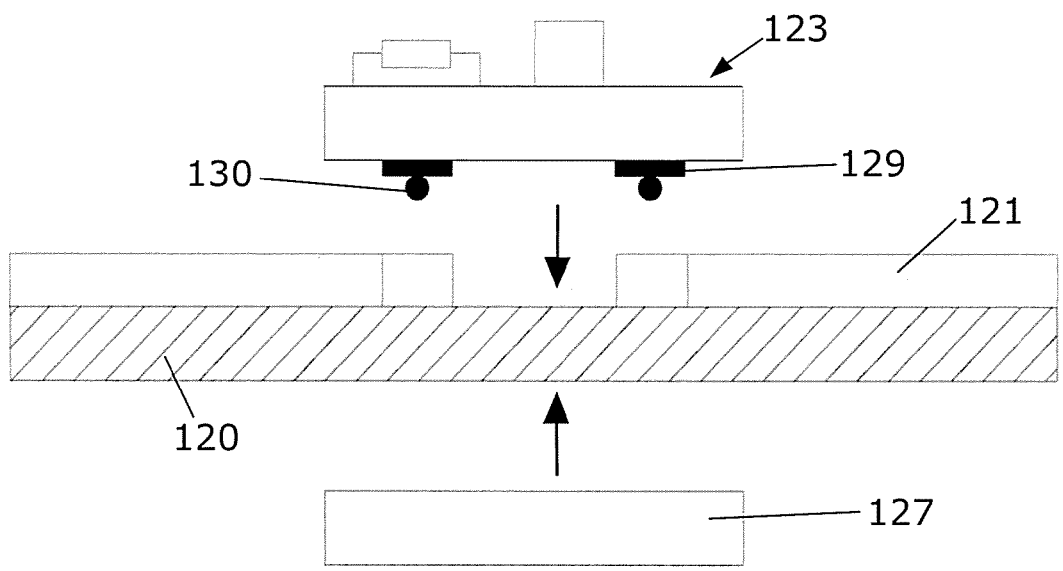
FIG. 11 shows a cross sectional view of a third embodiment of the invention where there further resides an insert between the substrate and a circuit board.

FIG. 11 shows a cross sectional view of a third embodiment of the invention where there further resides an insert between the substrate and a circuit board. In particular, FIG. 11 shows a deformable substrate 120 having conductive tracks or wires 121 attached thereto. Each stretchable wire end is bare in that no special preparation for connection is required other than an exposed conductive region on the top side where a connector is to engage.

A circuit board 123 is shown above the substrate 120. The circuit board has, on the lower surface or at least the surface for engagement with the substrate, a frustospherical connector 130 or bump adapted for engagement with the wire 121 of the substrate. The bump 130 is preferably a spherical conductor of a kind typically utilized by a flip chip. Preferably the bump is made of gold, or at least gold plated for high conductivity potential and resistance to oxidization. However, other high conductively materials could also be used, for example silver, aluminum, copper or carbon. In some varied embodiments, the bump 130 is supported or mounted to a conductive mounting pad 129.

In use, a circuit board is lowered toward the substrate such that bumps 130 on the circuit board 123 come into contact with the surface of the wire 121 mounted to the substrate 120. The bumps 130 may further press into the wire 121, which is a softer material such as conductive silicone. A holding force is preferably applied to the resulting structure to hold the components together. In some varied embodiments, as shown in FIGS. 10 and 11, a support plate 127 may be provided beneath the substrate such that the clamping load is spread over a region of the substrate greater than the mere surface area provided by the terminal connection. In this way, a reliable electrical connection is maintained between the circuit board and the wires printed on the substrate 120.

The third embodiment provides advantages including that the bump connection 130 with the circuit board 123 will have more buffer to becoming disconnected even if the stretchable substrate is slightly distorted. This advantage is facilitated at least in part by having the bumps 130 embed at least partially into the conductive silicone wires 121 to provide a three-dimensional connecting surface.

The following embodiments relates to methods of attaching deposited wires directly to a circuit board without intermediary connecting elements, and to the devices that results from those methods. In particular, FIGS. 12 (a)-(c) show a stretchable conductive wire deposited on a stretchable substrate and attached to a circuit board. The stretchable wires may be deposited by a number of methods. That is, stretchable wires are formed independently and mechanically coupled to the stretchable substrate, or deposited directly on the stretchable substrate, using a deposition or assembly process that applies conductive liquid material to the stretchable substrate layer or a temporary substrate which is then allowed to dry, cool or cure into a flexible, deformable wire that is attached to the substrate. The stretchable wires depicted are preferably formed from a conductive silicone-based material.

The circuit board 150 comprises one or more vias or cavities 152 situated near the board edge as shown in FIGS. 12(a) and (b). The vias may be through-plated with a conductive material as is widely used in the art, and either extend through a portion of a PCB track 151 as shown or are at least electrically connected to a PCB track in some way. The diameter of the vias or cavities 152 should be large enough to allow for the viscosity of liquid material used to form a stretchable wire. This means the vias or cavities should be large enough not to affect flow into and through the vias or cavities, either gravitationally or when the material is injected into the via. The diameter may be around 0.1 mm to 3 mm, for example. When the material is injected into the via or cavity, the via or cavity diameter is not especially critical. However, as the material forms a mechanical bond with the via or cavity, a greater via or cavity diameter will provide for a stronger mechanical connection by allowing more stretchable wire material to pass through the via or cavity. Stretchable wire material is typically extruded or injected into place using an injection needle.

The circuit board 150 may be attached directly to the stretchable substrate by any suitable means including an adhesive, a fastener, or a combination thereof. Conductive silicone is applied through the via or cavity in the circuit board and electrically connects to at least the conductive pad on the surface of the circuit board but more preferably electrically connects plating that extends through the via and connects to the exposed conductive surface of the opposed stretchable wire on the stretchable substrate. A conductive trace on the circuit board extends from the conductive pad as is common in the art.

The conductive material of the wire injected or flowed into through the circuit board vias tethers the circuit board to the stretchable substrate.

The circuit board may comprise an electrically conductive pad disposed on one surface of the PCB such as shown in FIG. 12(a), or two matching electrically conductive pads on opposing surfaces of the PCB as shown in FIGS. 12(b) and 12(c). One or more vias may extend through the PCB with a pad on one side of the board. Or, a via may extend through the circuit board to electrically connect opposed conductive pads. The inner wall of the vias or cavities may be lined with a conductive plating to increase the surface area available for an electrical interconnection with the stretchable wire to be made.

Excess conductive material may be applied to multiple adjacent circuit board vias or cavities form one electrical connection to provide an electrical connection between the stretchable wire and the conductive pad of the PCB. A mechanical bond is also created between the stretchable wire and stretchable substrate and the PCB by the material that extends into the vias or cavities. Excess stretchable material can be applied to form a bridge of conductive material that spans multiple vias or cavities over the top side of the PCB, thereby creating a composite structure where at least part of the top and bottom surface of the PCB is embedded in the conductive material injected to make a connection between the stretchable wire and the conductive track on the PCB.

Preferably adjacent vias or cavities are formed along a single circuit board track. An optimum configuration is shown in FIG. 12(a) where two vias or cavities are aligned along a circuit board track with one circuit board via proximate the circuit board edge and the other distanced from the edge. The via or cavity closest to the circuit board edge absorbs most of the mechanical strain applied to the joint while the inner via or cavity provides a more stable electrical connection. In some variations, only the inner circuit board via or cavity need be conductive and electrically couple to the stretchable wire.

In some varied embodiments, the conductive silicone described above is substituted with conductive thread that is sewn into the stretchable substrate. However, the thread would need to be insulated from the other conductive regions that are not to be electrically connected in the region it is sewn into, and conductive only at the point where it connects to the PCB. For example, wire coated with an insulating substance such as enamel could be used. The insulating substance could be removed from the wire portion that connects to the PCB, or the wire prepared such that only desired portions of the wire are insulated and/or exposed.

In yet other embodiments a direct connection can be made using the same conductive silicone material as the stretchable wire. Using this approach the PCB can be connected to a device which is taking capacitance measurements and as the conductive silicone is injected through, a visual test can be made of the connection being made to determine whether the cables and capacitive sensors have made a good connection and are working within the capacitance range expected.

The following embodiment relates to a method of attaching stretchable wires directly to a circuit board without intermediary connecting elements, and to the device that results from that method.

FIGS. 13-22 show a process whereby a circuit board is attached directly to a stretchable substrate having conductive wires deposited on the surface of the stretchable substrate. In particular, conductive tracks formed on the circuit board are directly connected to stretchable wires deposited on the substrate. The circuit board is secured to the stretchable substrate and is placed over the top of the stretchable wires. As above the circuit board may form a hub or node where one or more sensors are connected. The sensors may be of a kind used for detection of human body position and movement. By providing a circuit board with sensor interface and processing capability directly on the stretchable substrate, the requirement for remotely located or outboard equipment can be avoided.

Figure 15:
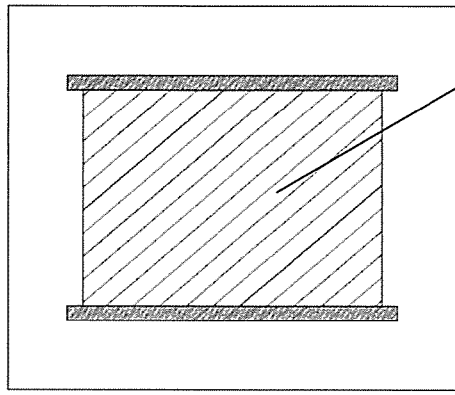
FIG. 15 shows a silicone dielectric material applied to the substrate which acts as a bonding agent.
Figure 16:
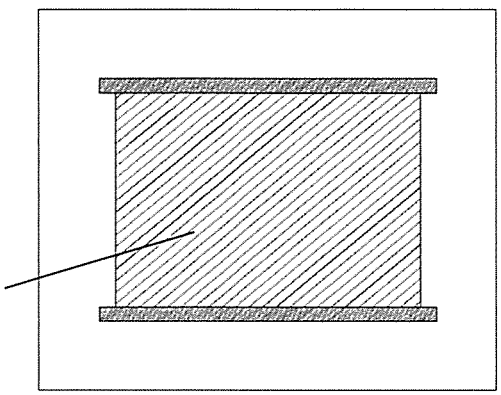
FIG. 16 shows the substrate coated in dielectric material 161 after it has been heated and cured.

Accordingly, a process part comprises the steps to prepare the substrate material of:

a. Providing the substrate;

b. Applying corona/plasma treatment or chemical etching to break molecular bonds on the surface of the stretchable substrate;

c. Depositing an interfacial material on the stretchable substrate such as a silicone that subsequent stretchable electronic element components or layers can be affixed to; and d. Applying heat to cure the interfacial material FIGS. 13 and 14 show a sample section of stretchable substrate 160 of a kind suitable for accepting stretchable wires. The sample shown is 12 cm square of 3M pre-masking tape. The substrate is subject to surface treatment to break molecular bonds in the substrate material to activate or modify the surface properties, by corona/plasma treatment or chemical etching for example. An interfacial dielectric material to which the stretchable wires will adhere to is applied to the substrate using a doctor blade device. In this example, the interfacial material is silicone. FIG. 15 shows the silicone dielectric material applied to the stretchable substrate which acts as a bonding agent and FIG. 16 shows the stretchable substrate coated in dielectric material 161 after it has been heated and cured. The particular dielectric material used in this example was heat cured. After the curing process it is observed that silicone dielectric is strongly bonded to the stretchable substrate compared to if the surface of the stretchable substrate was untreated.

The following description details a possible addition to the invention mentioned so far which could potentially increase the strength of the bond between a flexible electronic component and a rigid electronic component comprising etched copper pads or tracks on a rigid circuit board. This embodiment enables a rigid electronic component to increase the available area for bonding of its copper conductive elements by intentional over-etching of the copper during production or at a later stage before bonding to a flexible electronic component. This addition could serve to increase the integrity of the bond between a flexible electronic component and a rigid electronic component.

FIG. 35 illustrates an interconnect 89 according to an embodiment of the present invention. The interconnect 89 provides interconnection between a soft electronic component electrode 4 and rigid electronic components provided on a circuit board 90. In this example the sensor 1 is a capacitive deformation sensor having an electrode 4. In this particular example the sensor 1 is a stretch sensor.

As shown in FIG. 35, electrode 4 has shielding electrodes 2 and 3 shown under and over signal electrode 4. As shown, dielectric layers 5 and 6 separate the signal electrode 4 from shielding electrodes 2 and 3.

Also shown in FIG. 35 is an encapsulation layer 17 which encapsulates both the sensor 1 and the interconnect 89 and protects the other layers of the sensor 1. Also shown is a bonding layer 18 which bonds the layers 3 to stretchable substrate 88.

FIG. 35 shows printed circuit board 90 contacting carrier 95 which is also bonded to stretchable substrate 88.

FIG. 35 also shows that the interconnect 89 has a lip 93 which defines a recess 74 to receive and locate the printed circuit board 90 in a position where the contacts 91 of the interconnect and contacts 92 of the printed circuit board are aligned, looking into the page, to provide connection between electrode 4 and the printed circuit board 90.

Not visible in FIG. 35, similar contacts would be provided in a direction as shown in or out of the page for the shielding electrode 2 and the other shielding electrode 3.

FIG. 36 shows an exploded plan view of the interconnect 89 with recess 94 defined by lip 93 for receiving and locating the printed circuit board 90. As shown a shelf 95 of substrate material supports an array of contacts 87.

FIG. 37 illustrates a contact 210, according to a further embodiment, for a flexible electrode 4 from a sensor 1 to connect to a rigid copper trace 214 on substrate shelf 218 according to an alternative embodiment of the present invention. The contact 210 in this example has three prongs 221, 222 and 223 of conductive material.

In this example the cavities 224 and 225 extend for a length L from an edge 226 of the shelf 218. Also in this example, the cavities 224 and 225 have been formed by over-etching the material of the contact for a time, in this particular example, to form cavities which have an opening which is narrower than a main cavity compartment. The reader may recognise the prongs 221 to 223 as forming a striated connector or pad 210.

In this example the conductive material is a layer of printed circuit board, such as a copper layer. The weight of copper for a printed circuit board contact may typically be ½ Oz/ft^2, 1 Oz/ft^2, 2 Oz/ft^2 or more. Note, a weight of copper of 1 Oz/ft^2 provides a 17 micron thickness of contact. In this example also the contacts 210 is used with conductive silicone contacts 204 and a weight of copper of 2 oz is selected to provide 34 micron thickness. In this example the first three layers, layers 18, 3 and 6, shown in FIG. 35 are built up to an appropriate height as the copper contact 210.

FIG. 38 shows a contact 310 and contact 314 according to a further alternative embodiment of the present invention. In this embodiment the contact 310 has five fingers 331, 332, 333, 334, and 335 which define cavities similarly to the contact shown in FIG. 37.

FIG. 39 shows a contact 410 and trace 414 according to a yet further embodiment of the present invention. In this example a cavity 424 has a closed shape as would be seen in a plan view. In this example also a cavity 425 is open to an edge of the contact 410.

FIG. 40 shows a contact 1410 and 1414 according to another embodiment of the present invention. In this example a cavity 1424 encircles an island of material 1426 which remains after etching to act as an anchor. The island in this particular example does not form part of a contact 1410 as is has been disconnected from the rest of the contact 1410 by etching. The cavity 1424 of this example is open to the edge of the contact 1410. In this example the encircling cavity is in the approximate form of an ellipse.

FIG. 41 shows a cutaway elevation of an interconnect 512 according to an additional embodiment of the present invention which is, nevertheless, similar to the embodiment shown in FIGS. 37 and 38. FIG. 41 shows fingers 521, 522 and 523 defining cavities for 524 and 525. As shown in FIG. 41 the cavity 524 has an overhang 527 so that a dimension 528 of the cavity 524, represented as a width across the page in this view, is greater than a dimension 529 representing the width, in this view, of the opening 530 of the cavity 524. The cavity 524 is shown delimited against the substrate 518. The reader will recognise the opening 530 as constricted, or narrowed, with respect to the rest of the cavity 524.

As also shown in FIG. 41 the cavity 524 has at least one wall 532, extending from an edge 533 of the cavity 524 to the substrate 518, which is concave. The wall 532 bows out from the centre of the cavity 524. In the embodiment shown in FIG. 41 the cavities 524 and 525 are formed by an etching process using a layer of material 534 to resist etching and provide a mask. In this example the material 534 is a lead amalgam. As shown in FIG. 41 also the cavities 524 and 525 are over-etched compared to the degree of etching required simply to define fingers 521 to 523. This over etching provides the concavity of the walls, such as 532.

As the applicant has observed, if the cavity were filled with material (not shown) the material would be retained in the cavity unless it deformed suitably to pass through the narrowed opening 530. As the applicant has observed an elastic material which is substantially non-compressible, or non-compressible in the context of forces which occur in a deformation sensor would be prevented by substrate 518 from deforming suitably to pass through the opening 530. Therefore, the material and any material it is connected to above, as shown in FIG. 41, the cavity 524 would be firmly retained in the cavity against removal through the opening 530.

The applicant has further observed that any shrinkage occurring in a material in the cavity 524 and in a layer above, as it would appear in FIG. 41, would cause the material to be forced against the overhanging boundary 531 of the cavity 524 as illustrated by example only by arrows A and B. The applicant has observed that this forcing would further retain material in the cavity 524 and would also facilitate contact between the material and the contact fingers 521 and 522, for example. In the present embodiment, the material (not shown) is applied to the cavity 524 as a liquid material which cures or sets to form a soft conductive electrode such as electrodes 2, 3 or 4 of FIGS. 1,2 and 35. In this embodiment of the electrode material may be applied to enter the cavities 524 and 525. In this example the material is squeegeed to remove excess above the fingers 521 to 523 before another layer of material (not shown) is applied to form an electrode, such as 4 for example, of a soft electronic component. The material the soft electronic component is then cured and the material in the cavity 524, for example, with narrowed opening 530 will set to a soft but solid state and will act as an anchoring part, or latching plug, of the soft electronic component 1.

FIG. 42 represents an image of an interconnect 612, similar to that of FIG. 41 but according to an alternative embodiment of the invention. Three finger-contacts, or contact striations, 621, 622 and 623 define cavities 624 and 625 which have been formed by over-etching using a chemical etching compound and a masking material 632. The masking material is plated back onto the copper contacts 621, 622 and 623, increasing the overhang over the cavity. Cavity 624, for example, has concave wall 632 so a width dimension of the cavity is greater than a width dimension of the opening 630. In this example a contact layer 610 has been etched through. The contact layer defines the cavity opening 630.

FIG. 43 depicts the shape of a cavity 724 which is formed by different development times. FIG. 43 shows a series of alternative cavity walls, 732a to 724f which would be formed by progressively longer etching times.

FIG. 44 shows a cutaway side elevation of part of a soft electronic component 901 with integrated interconnect 912 according to another embodiment of the present invention.

FIG. 45 shows a plan view of the same soft electronic component 901 of FIG. 44. The plan view is aligned with FIG. 44.

As shown in FIG. 44 and FIG. 45, a substrate ledge 918 supports a contact 910 for a signal layer 904 of a soft electronic component 901 integrated with the interconnect 912. The cavity 924 with narrowed opening 930 has received therein an anchor 937 of material forming part of the electrode 904. In this example the electrode layer 937 has been applied in a separate step to the electrode 904. The material 937 was applied in a liquid, mouldable or otherwise un-cured state. As shown in FIG. 45 the anchor 937 is wider than the opening 930 so the anchor 937 and bonded electrode 904 are firmly secured to the contact 910. As shown in FIG. 45 the cavity 937 is elongated and extends for a length.

FIG. 46 and FIG. 47 show a cut-away side elevation view and aligned plan view of a soft electronic component 1001 with integrated interconnect 1024 loading to electronic circuitry (not shown). In this example, an anchor part 1037 is formed by applying uncured electrode material in a single step. In this particular example, the walls, such as 1032 are not concave. In this example also the cavity 1024 has a recessed profile, as seen in plan view.

FIG. 47 shows a cavity 1024 in the form of a truncated diamond with a narrowed opening 1039 which opens to an edge 1040 of the contact 1110. As shown in FIG. 46 the cavity 1024 has a width dimension 1042 which is greater than a width dimension of the opening 1039 so that once cured the anchor 1037 will be retained in the cavity 1024 to resist forces in the direction C and anchor the electrode 1004 to the contact 1010.

FIG. 48 shows a cut-away elevation of an interconnect 1112 of another embodiment of the present invention with two fingers 1121 and 1122 of a contact projecting, in elevation view, from the substrate 1118.

The fingers 1121 and 1122 define a cavity 1124. Undercuts 1137a and 1137b of the fingers provide a cavity 1124 with a width 1128 that is greater than the width 1129 of the opening of the cavity.

FIG. 49 shows an elevation view of an interconnect 1212 according to a further alternative embodiment. As shown in FIG. 49 a finger 1221 of a contact 1210 projects from the shelf 1218 to form a cavity 1224 underneath a ledge 1227 of the contact. In this embodiment the contact 1210, or the interconnect, provides an anchor for the electrode 1204.

FIG. 50 shows a contact 1310 and trace 1314 according to a yet further additional embodiment of the present invention. In this example multiple cavities 1324a, 1324b, 1324c, 1324d, and 1324e have a closed shape as would be seen in a plan view. In this example also a cavity 1325a, 1325b and 1325c is open to an edge of the contact 1310.

FIG. 51 shows a contact 1410 and trace 1414 according to a yet further additional embodiment of the present invention. In this example multiple cavities 1424a, 1424b, and 1424c have a closed diamond shape as would be seen in a plan view. In this example also a cavity 1425a and 1425b is open to an edge of the contact 1410.

FIG. 52 shows a contact 1510 and trace 1514 according to a yet further additional embodiment of the present invention. In this example multiple hatches 1524 and transverse hatches 1525 are formed in the contact 1510 to provide cavities there-between.

Further and additional embodiments will now be described.

In various embodiments an adhesion promoter may also be applied in the cavity in the cavity to improve retention of an anchor in the cavity. In some embodiments this may involve partially curing anchoring material such as silicone so that the cavity still retains some liquid form of silicone which gives extra suction. In some embodiments a cavity may be a polygon.

In some embodiments an expansion-curing material is included in the anchor part to expand at the anchor part cures to generate a force against surfaces inside the cavity to assist in retaining the anchor part in the cavity. In some embodiments the expansion-curing material may be polystyrene.

Some embodiments use triboelectric material.

Some embodiments have a layer of triboelectric material.

The applicant has also observed that an elastic material subject to thermal or mechanical stresses may have an abrasive effect on metal contacts which would act to remove oxides, residues or other layers which might impair contact between the material and the contact. This will improve the longevity of an interconnect. In various embodiments long term surface contact integrity is provided by mild abrasion in the interconnect surface due to micro-flexing in the soft material. Sweat or diluted salts in copper leads, for example, may lead to corrosion. In various embodiments silicone micro-flex removes the corrosion improving or maintaining electrical connection. In some embodiments the shape achieving this may be elliptical because rounded edges promote rotational flexing.

FIG. 35 shows an embodiment where the daughterboard the circuitry of the PCB, is placed on top of the carrier. In alternative embodiments the conductors are arranged such that the circuitry is placed on the underside of the carrier, so the daughter board fits below a cavity created by the carrier.

In some alternative embodiments cavities are formed in conductive material of printed circuit boards in the form of aluminium or other conductive materials known to the reader.

In some alternative embodiments concavity of walls of contacts, such as fingers 521 to 523 in FIG. 41 to give one example, are formed by laser processing.

In some alternative embodiments concavity of walls of contacts, such as fingers 521 to 523 in FIG. 41 to give one example, are formed by machining.

Various embodiments use any suitable modification to Equation 1 to determine a capacitance of a sensor.

In other embodiments dielectric layers of the soft component 1 are provided with anchor parts which engage cavities.

In some embodiments of the present invention an electrode, such as 4, to be connected is a trace of for another soft electronic component. In these embodiments the soft trace connects through a contact, such as 87, to a rigid trace, such as 91, of an interconnect 89.

Embodiments of the present invention provides a process for manufacturing a soft electronic component with an integrated connector for electronic circuitry, the process comprising the steps of:
  providing a connection component having contacts for electronic circuitry and defining one or more cavities in the connection component;
  applying an anchoring material to the connection component so as to cause ingress of the anchoring material into the cavity; and
  curing the anchor material to provide an anchor in the cavity for the soft electronic component.

In some embodiments the anchoring part may be formed of an elastomer.

In some embodiments the process comprises applying electrode material to the connector to provide an electrode of the soft electronic component which is in contact with the connector.

In some embodiments the electrode material comprises material which may bond to the anchoring material to allow anchoring material to be anchored to the connector component.

In some embodiments the electrode material is applied prior to curing the anchoring material. The electrode material is cured.

In some embodiments electrode material is used as anchoring material.

In some embodiments the cavity has an opening for the anchoring material which is narrower than another dimension of the cavity so as to retain the anchoring material in the cavity.

In some embodiments the process comprises removing excess anchoring material from the connector.

In some embodiments the electrode material and/or the anchoring material is operable to shrink as it is cured.

In some embodiments the electrode material comprises solvent which disperses conductive particles and causes shrinking upon curing of the electrode material.

In some embodiments the process comprises the step of forming one or more electrodes of the soft electronic component by applying electrode material in a liquid form and may comprise the step of curing the material.

In further embodiments the electronic components are interconnected with electronic circuitry on a circuit board may comprise conductive fabric forming capacitances, traces and other electronic components.

Figure 17:
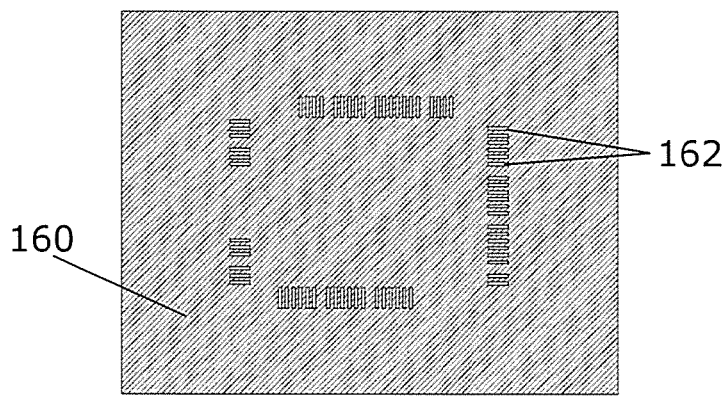
FIG. 17 shows electrode material 162 applied to the prepared substrate.

FIG. 17 shows the result of a second process part where electrode lines are prepared on the substrate. The electrode lines form both a conductive track for connection with one or more stretchable wires deposited on the substrate, and a conductive material to which a track on a circuit board is to be connected. In particular, the electrode lines are patterned and deposited separately and transferred onto the interfacial dielectric layer bonded to the stretchable substrate, or patterned and deposited directly onto the interfacial dielectric layer bonded to the stretchable substrate. FIG. 17 shows electrode material 162 applied to the prepared substrate. In preferred applications, uncured electrode material is formed directly in a desired layout to be applied to the on the stretchable substrate to which it will be bonded.

Accordingly the second process part comprises the following steps to prepare electrode lines:
  a. Provide a pattern or layout desired for the electrode lines
  b. Deposit uncured electrode material in the desired pattern or layout either on a temporary substrate or directly on the stretchable substrate of the final assembly
  c. Separate the pattern and the substrate from any apparatus or tool required to create the pattern.
  d. Cure the electrode material A PCB is aligned with PCB tracks that correspond to the electrode lines deposited on the substrate. The conductive tracks on the stretchable substrate are electrically connected to the PCB tracks upon making physical contact. Various embodiments of the present invention augment the mechanical and electrical quality of the connection made by making physical contact between the stretchable wires and the PCB tracks. The connection is able to be verified by measuring the electrical resistance across the PCB track and the conductive tracks on the substrate.

Figure 18:
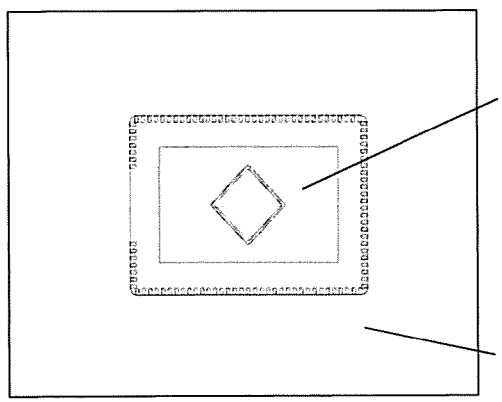
FIG. 18 shows an exemplary PCB laid over a substrate.
Figure 19:
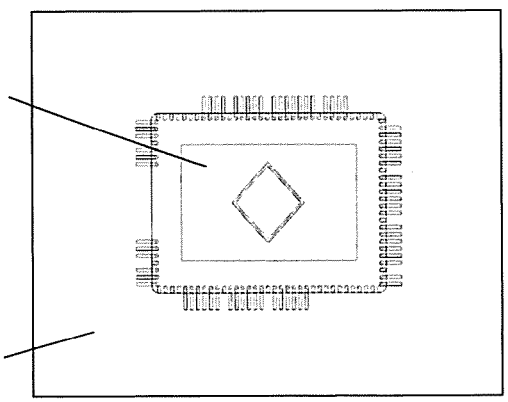
FIG. 19 shows another exemplary PCB laid over a substrate.
Figure 20:
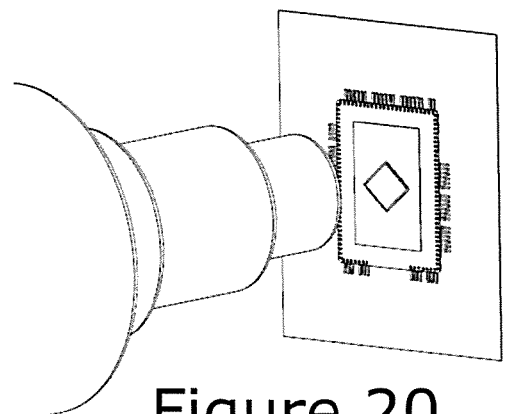
FIG. 20 shows a heat gun applied to the PCB and substrate to bond the assembly together.

FIG. 18 and FIG. 19 show an exemplary PCB 150 laid over a substrate 160 with conductive tracks therebetween. The silicone dielectric coating the substrate is cured using heat to bond the PCB to the stretchable substrate. A very thin layer of the dielectric bonds the PCB over the stretchable substrate without affecting the electrical connection between the PCB and the stretchable wires even when the stretchable substrate is stretched. FIG. 20 shows a heat gun applied to the PCB and stretchable substrate to bond the assembly together.

Figure 21:
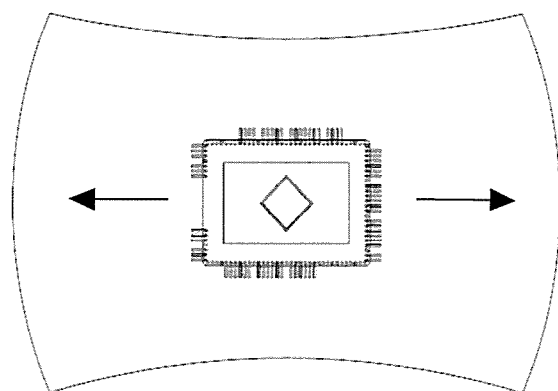
FIG. 21 illustrates stretching of the substrate which shows a strong bonding to the PCB without losing the electric connection between these components.
Figure 22:
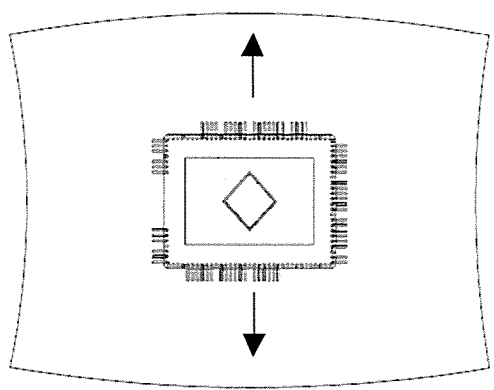
FIG. 22 illustrates stretching of the substrate which shows a strong bonding to the PCB without losing the electric connection between these components.

FIGS. 21 and 22 illustrate stretching of the substrate which shows a strong bonding to the PCB without losing the electric connection between these components. Therefore it has been observed that PCB to conductive silicone lines deposited on the stretchable substrate using surface treatment using dielectric adhesion glue is strongly bound. The resistance measured when the PCB was first bonded to the substrate was 1167±495Ω and after a stretching process measured 2156±394Ω. This resistance is good and low enough to be functional in a circuit such as a stretchable substrate on a human body to detect human motion by a network of sensors located on the substrate are coupled to the PCB.

The following description details a possible addition to the invention mentioned so far which could potentially increase the mechanical robustness of a connection between a flexible electronic component and a rigid electronic component. This addition of a pin or similar mechanical attachment method as and/or a leaf spring or similar mechanical force application method could reduce relative motion of the flexible electronic component and rigid electronic component to ensure that the electrical pathway created by the connection of the flexible and rigid electronic components continues to function as part of an electronic circuit.

FIG. 53 shows an interconnection device, or interconnect, 101 which according to an embodiment of the present invention. The interconnect 101 electrically and mechanically connects a first electronic component 102 to a second electronic component 103. The first electronic component 102 in this example is a soft electronic component. In this particular example the soft electronic component 102 is stretchable. The soft electronic component 102 has terminals 104a and 104b which the interconnect 101 connects to respective contact terminals 105a and 105b provided on the second electronics component 102. In this example the contact terminals 104a and 104b oppose the contact terminals 105a and 105b.

The device one has contact elements 106a and 106b formed of a conductive material which is compressible between terminals 105 and 105. In this example, the material used for the contact elements 106 is a matrix material having a dispersion of particles to impart a conductive property. In this specific example the materials used are silicone with the dispersion of carbon particles. In this example the contact elements 106 are provided as projections bonded to the terminals 104. In the example shown in FIG. 53, the soft electronic component 102 is bonded to a stretchable substrate. In this example the substrate 107 is a stretchable fabric.

The second electronic component 103 of this example is a printed circuit board. In this particular example the printed circuit board 3 is rigid.

The circuit board 103 has an aperture 108 for a pin 109. The pin 109 connects the circuit board 108 to a biasing element 110. In this example the biasing element 110 is a leaf spring which is biased by the pin 108 and the board 103 so as to act to pull the pin downwards in the page shown.

The device 1 has a stretch-resistant element 111 bonded to the stretchable substrate 107 to which the stretchable electronic component 102 is bonded. As shown in this example, the stretch-resistant element 111 extends just beyond the contacts 104a and 104b and contact elements 106a and 106b, or just wider than their separation. The stretch-resistant element 111 has an aperture 112 to receive the pin 109. The compressed spring 110 bears against the stretch-resistant element 111 to provide a force for the stretch-resistant element 111 and contacts 104, under compression provided by the pin 109, towards the terminals 105 of the circuit board 103.

The device 101 also has a layer 112a of complaint material over-moulded over the terminals 104 and 105, contact elements 106, circuit board 103, pin 109 and part of the stretchable electronic component 102 in a region where it connects to the printed circuit board 102.

The device 101 also has an over-moulded layer 112b complaint material moulded over the pin 109, spring 110 stretch-resistant element 111 and fabric substrate 107.

The operation of the device will now be described. The pin 109 anchors in the circuit board 103 at the aperture 108 in the circuit board 103 and provides tension to compress and flatten the leaf spring 110 towards the circuit board 103. The leaf spring 110 bears against the stretch-resistant element 111, which is bonded to the stretchable electronic component 102 in a region which includes the terminals for and contact elements 106. The action of the leaf spring 110 forces the terminals 104 towards terminals 105. The terminals 105 resist the force by the rigidity of the circuit board 102 and the action of the pin 109. The reader will appreciate that the anchor aperture 108, pin 109, leaf spring 110 bearing on stretch-resistant element 111 collectively provide a biasing mechanism to bias the stretch-resistant element 111 and the terminals 104 towards the circuit board 103 and terminals 105. This biasing also compresses the contact elements 106 which are resilient and therefore provide a firm electrical interconnection of the terminals 104 and 105 and a firm mechanical connection of the soft electronic component 102 to circuit board 103. The stretch-resistant element 111, which is bonded to the substrate 107, provides a stretch-resistant region of the soft electronic component 102. The stretch-resistant region encapsulates the terminals 104 and mitigates movement of terminals 104 relative to terminals 105. Otherwise compression may otherwise cause misalignment of the terminals 104 by stretching of the fabric substrate 107 and soft electronic component 102.

The reader will be aware that the pin 109 is acting as a tension element between the circuit board 103 and the compressed leaf spring 110. The degree of compression of the spring can be determined in part by the length of the pin 109. The compressed leaf spring 110, which is compressed by tension through the pin 109, acts to force the terminals 104a and 104b towards the terminals 105a and 105b and to compress the contact element 106a and 106b between the terminals.

The following description details a possible addition to the invention mentioned so far which serves to reduce the shear strain at the boundary between a soft electronic component where that component is bonded to a rigid electronic component. This addition of a 'non-stretch zone' enables the creation of a localized area of the flexible component which experiences dramatically reduced strain when the flexible component is stretched during normal use. This 'non-stretch zone' allows for less stress to be transmitted to the area of flexible to rigid bonding, decreasing the chance of this bond ceasing to hold during normal operation.

Figure 27:
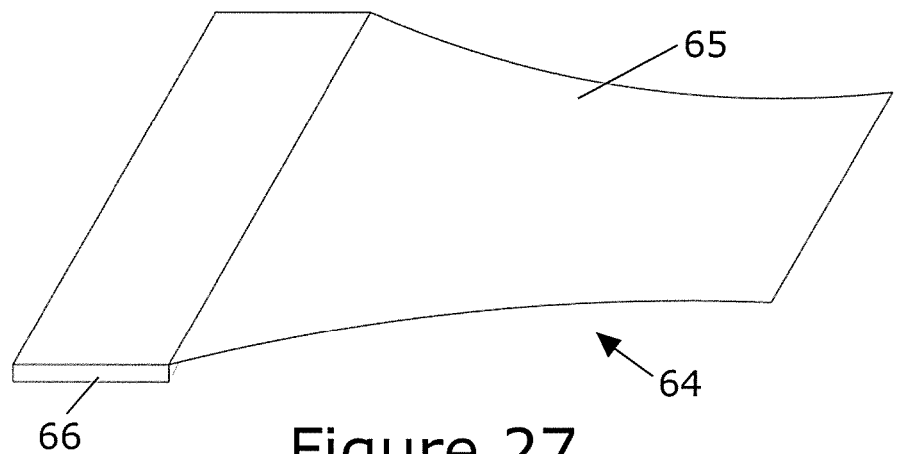
FIG. 27 shows a perspective view of a device according to another embodiment of the present invention.

FIG. 27 shows a device 64 having a soft electronic component 65 which, in this example, is stretchable in direction A. Electrodes (not shown) of a soft electronic component 65 are bonded to a circuit board 66. The circuit board 66 of this example is rigid. The circuit board 66 of this example has a planar shape. In this example the circuit board 66 is used to anchor the soft electronic component 65 while, in use, the soft electronic component 65 is stretched in direction A. As shown direction A is aligned with the circuit board 66 and away from the circuit board 66 to stretch the soft electronic component 65. In this example also the soft electronic component is a deformable capacitor which changes in capacitance with deformation. In the intended use of the example shown in FIG. 27 the soft electronic component 65 senses strain, or stretch in this case, due to stress in direction A.

Figures 28, 29:
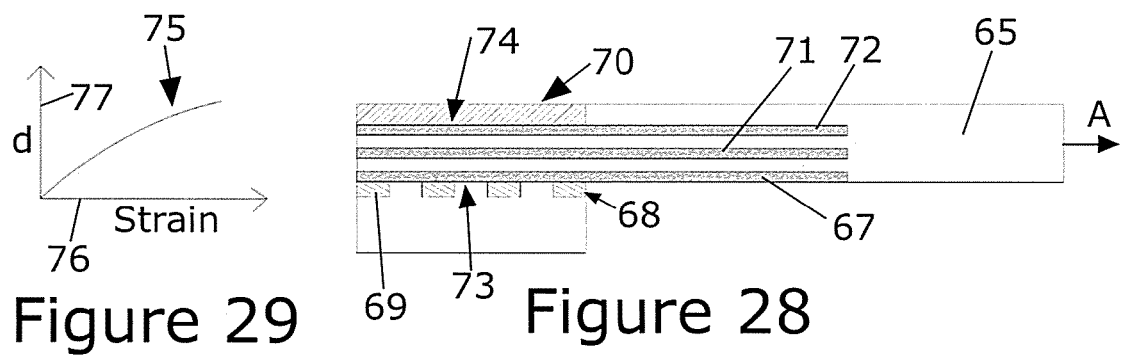
FIG. 28 shows a cutaway side elevation of a device according to the embodiment of FIG. 27.
FIG. 29 shows a plot of strain occurring in a device according to the embodiment of FIG. 27 and FIG. 28.

FIG. 28 shows a cut-away side elevation of the device 64 of FIG. 27. FIG. 28 shows one of the electrodes 67 of the soft electronic component 65 bonded to an electrode 69 of the circuit board 66.

FIG. 28 also shows a surface 68 defined by the bond between the electrode 67 and 69 and shows a surface 70 on an opposite side of the soft electronic component 65 from the bonding surface 68. Specific electrodes, such as 67, of the soft electronic component are bonded to the electrodes, such as 68 of the circuit board 66. Dielectric material (not shown) between locations where given electrodes are bonded are also bonded to the circuit board 66.

In this example, electrode 67 and additional electrodes 71 and 72 extend beyond a part of the soft electronic component 65 that overlaps and is bonded to the circuit board 66. The soft electronic component 65 is able to deform in response to stress to change the geometry of the assembly of electrodes 67, 71 and 72 to change electronic characteristics of the soft electronic component 65. In the example shown in FIG. 28 the stress is in direction A and the deformation is a stretching deformation. In this example the electrodes 67, 71 and 72 are formed of films of elastomeric material which have a dispersion of particles which impart a conductive characteristic.

As the stress in direction A is parallel to the circuit board 66 and the bonding surface 68 and will provide a shear stress above the bonding surface 68. Strain occurring at the bonding surface 68 will be zero. As the reader will be aware the bond provides a boundary condition for strain so long as a stress threshold is not exceeded and the bond holds. A three-dimensional zone 20 immediately adjacent the bonding surface 68, or a finite distance from it, will experience a finite and small strain in response to a stress in direction A. The zone 73 may be referred to as a low strain zone.

As the distance from the circuit board increases so does the strain which results from stress in direction A.

By contrast to the low strain zone 73, a zone 74 immediately adjacent, or below as shown, the opposite surface 70 will experience a higher degree of strain in response to stress apply to the soft electronic component 65 in direction A. This is because it is further away from the bonding surface which applies a zero strain boundary condition.

FIG. 29 illustrates strain occurring in the soft electronic component 65 in a part which overlaps the circuit board 66. The strain shown is that occurring in response in response to stress in the direction A while the circuit board is anchored or pulled against the strain. The result of the strain in this example will to stretch the component 65 parallel to and way from the circuit board 66.

FIG. 29 shows a plot 75 of the magnitude of strain components parallel to the circuit board 66 as it varies with distance from the surface on circuit board where the electrodes 67 and 68 bond. Magnitude of the strain component is shown on the horizontal axis 76. The distance from the bonding surface is shown on the vertical axis 77.

The vertical axis 77 is aligned with the thickness of the soft electronic component 65. As shown in FIG. 29 the component of strain, in the direction of stress, increases with distance from a bonding juncture at the bonded surface of the soft electronic component 65.

Figure 30:
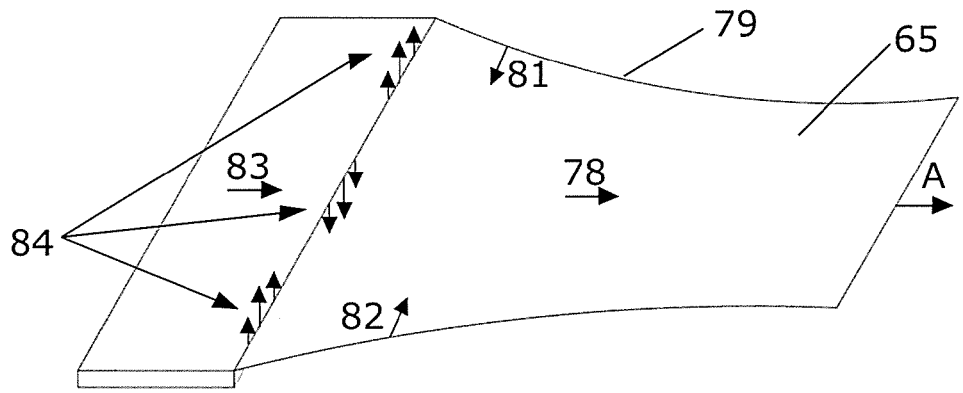
FIG. 30 shows a perspective view of a device according to the same embodiment as FIG. 27 and FIG. 28 and illustrates various strain effects occurring in the device.

FIG. 30 illustrates various strain effects occurring in the component 65, shown in FIGS. 28 and 29, as a result of stress in direction A.

Strain is illustrated in FIG. 30 with vectors. Strain 78 in direction A occurs in the part of the soft electronic component 65 which does not overlap circuit board 66. In the same part of the soft electronic component 65 edges 79 and 80 are inwards with strain 81 and strain 82 as shown. FIG. 30 also illustrates a sheer strain component 83 which is parallel to the circuit board 66 and aligned with the direction A.

FIG. 30 also illustrates strain components 84 which are normal to the circuit board 66. With sufficient stress in direction A normal strain components 84 exhibit a variation in magnitude and sign, or direction. These normal components 83 can cause delamination of the soft electronic component 65 from the circuit board 66 when a threshold of stress in direction A is exceeded, or a threshold of force on the soft electronic component 65 in direction A is exceeded.

Figure 31:
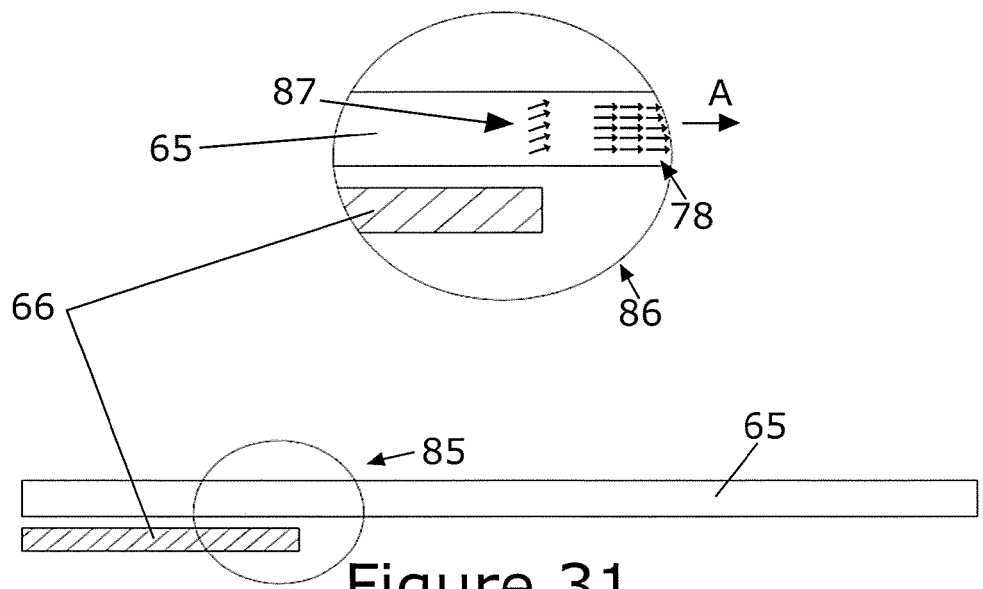
FIG. 31 shows a cutaway side elevation off a device according to the same embodiment as FIG. 27, FIG. 28 and FIG. 30 and illustrates additional strain effects occurring in the device.

FIG. 31 further illustrates various strain effects occurring in a device according to the same embodiment of FIGS. 27 to 30. FIG. 31 gives a cutaway side elevation 85 and a close-up cutaway side elevation 86. The close-up diagram 86 shows strain 78 aligned with the soft electronic component 65 in a part of the component 65 which is not overlapping the circuit board 66 and which is free to stretch. In this part, any boundary conditions for strain provided by the bond between the soft electronic component 65 and the circuit board 66 have negligible effect. Also shown in FIG. 31 is strain 87 which has a component that is normal to the circuit board 66.

Figure 32:
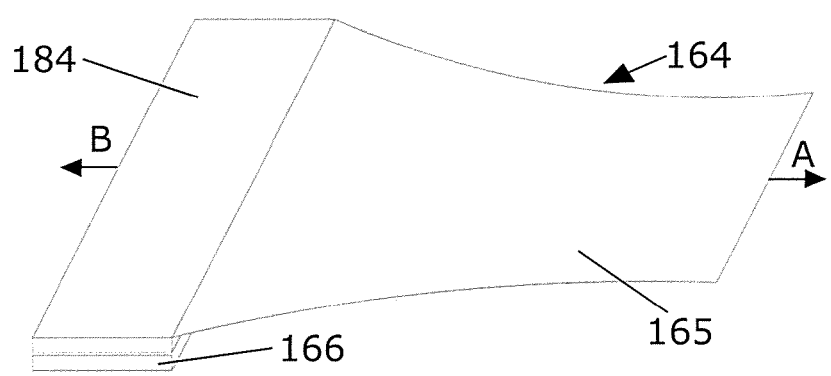
FIG. 32 shows a perspective view of a device according to an alternative embodiment of the present invention.

FIG. 32 shows a device 164 which has a soft electronic component 165 overlapping and bonded to a circuit board 166, similar to the embodiment illustrated with reference to FIGS. 27 to 31.

As shown in FIG. 32 the soft electronic component 165 is placed under stress in direction A. A restorative force in direction B is provided by the circuit board 166 to hold the device in position against the stress in direction A. In this embodiment, the device 164 has a strain resisting element 184 bonded to the soft electronic component 165. The strain resisting element is bonded to a surface of the component 165 which is opposite and distal, facing away from, the surface to which the component is bonded to the circuit board 166. The strain resistant element 184 engages the soft electronic component 165 by nature of a chemical bond and is anchored with respect to the circuit board 166 so that it provides a restorative force in direction B in common with the circuit board 166. The strain resistant element 184 is formed of a material which is resistant to strain, at least in direction A as shown. In this particular example, the strain resistant element 184 is non-stretchable but flexible. This means that it will experience stress in direction A but will resist that stress. By engaging the soft electronic component 165 the strain resistant element 184 will act to resist strain occurring in the soft electronic component 165, specifically in the part of the component which overlaps the circuit board 166. By nature of being anchored with respect to the circuit board 166 and being bonded to an upper surface of the soft electronic component 165, which is bonded to the circuit board 166, the strain resistant element 184 will provide similar boundary conditions at the bond between element 184 and component 162 balance strain conditions resulting from the bond of the board 166 and component 162.

Figures 33, 34:
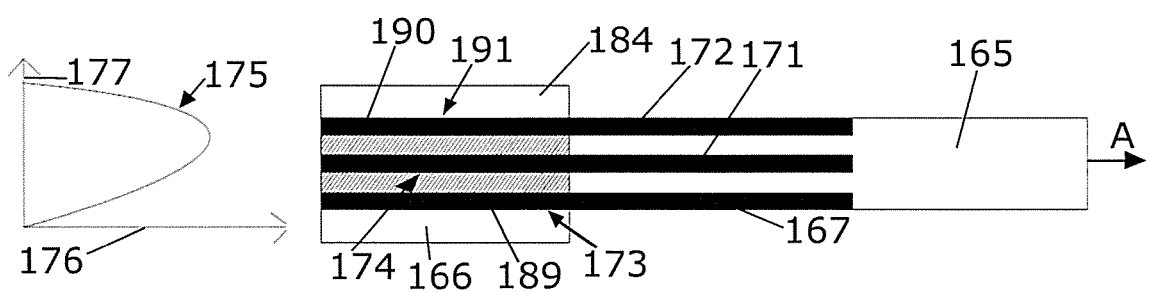
FIG. 33 shows a cutaway side elevation of the device according to the same embodiment of FIG. 32.
FIG. 34 shows a plot of strain occurring in a device according to the embodiment of FIG. 32 and FIG. 33.

FIG. 33 shows a cutaway side elevation of a device according to the same embodiment as illustrated with reference to FIG. 32. FIG. 33 shows the soft electronic component 165 experiencing strain in direction A.

FIG. 33 shows the soft electronic component 165 overlapping and bonded to the circuit board 166 at a bonding surface 189.

FIG. 33 shows a low strain zone 173 adjacent the surface 189 and caused by boundary condition provided by the bond to circuit board which is non-stretchable and rigid in this embodiment.

FIG. 33 also shows a strain resistant element 184 overlapping and bonded to the soft electronic component 165 at a bond surface 190 on an opposite and distal side of the soft electronic component 165 to the bond surface 189.

A bond along the bond surface 190 between the soft electronic component 165 and the stretch resistant element 191 provides boundary conditions which causes another low strain zone 191 located opposite the low strain zone 173.

FIG. 34 shows a plot 175 of strain occurring in the soft electronic component 165 in a part which overlaps the circuit board 166. The strain shown is that occurring in response in response to stress in the direction A. FIG. 34 shows a strain magnitude on a horizontal axis 176 and shows distance from the surface where the soft electronic component 165 is bonded on a vertical axis 177. FIG. 34 is aligned with FIG. 35 so that the strain magnitude is aligned with the direction A and the vertical axis is aligned with the distance within the soft electronic component 165 from the circuit board 166. As shown in FIG. 34 the magnitude of strain, in the direction of stress, increases with distance from a bonding juncture at the bonded surface 173 of the soft electronic component 165 to a maximum at a point between the circuit board 166 and strain resistant element 184 and then decreases to a bonding juncture at the bonded surface 190.

Further and additional embodiments will now be described.

In some embodiments similar to that illustrated with reference to FIGS. 27 to 30, terminals of electrodes which are bonded to electrodes of the circuit board may be separated, transversely to direction A, by dielectric material.

Some embodiments similar to that illustrated with reference to FIGS. 27 to 30 have dielectric material which has a lower Young's modulus that conductive material used in the electrodes. In the case of some embodiments in some conditions of use the lower Young's modulus of the dielectric material compared to the conductive material may exacerbate strain which acts to delaminate the soft conductive component from the circuit board.

In various embodiments the strain resistant element may engaging the soft electronic component so as to mitigate strain in the soft electronic component.

In some embodiments of the present invention conductive material used for electrodes of a soft electronic component have a higher Young's modulus than dielectric material used to separate the electrodes or material used to encapsulate electrodes.

In some embodiments the strain resistant element extends beyond the circuit board.

In some embodiments the strain resistant element has the shape of a sheet. In some embodiments the strain resistant element is resistant to strain along the sheet but is flexible. In some embodiments the strain resistant element is resistant to stretching. In some embodiments the strain resistant element is formed of a material which has a lower Youngs modulus that the soft electronic component.

In alternative embodiments to that illustrated with reference to FIG. 32, the strain resistant element may be resistant to strain, such as stretching, but have a Young's modulus which is higher than that of the soft electronic component.

In alternative embodiments to that illustrated with reference to FIG. 32, the strain resistant element may engage the soft electronic component with means other than a bond. Any suitable means known to the reader may be incorporated and may include prongs, barbs, stitching, complimentary mechanical features, or plugs.

It is to be understood that the present invention is not limited to the embodiments described herein and further and additional embodiments within the spirit and scope of the invention will be apparent to the skilled reader from the examples illustrated with reference to the drawings. In particular, the invention may reside in any combination of features described herein, or may reside in alternative embodiments or combinations of these features with known equivalents to given features. Modifications and variations of the example embodiments of the invention discussed above will be apparent to those skilled in the art and may be made without departure of the scope of the invention as defined in the appended claims.

The following description details a possible addition to the invention mentioned so far which could potentially decrease the difficulty of assembling a system comprising at least a flexible electronic component as well as a rigid electronic component by removing some or all of the active electronic components that would normally be present on the rigid electronic component. Relocation of active electronic components such as resistors, integrated circuits and capacitors to a separate PCB to be integrated at a later date could simplify manufacturing of such a system by not requiring these small and delicate components to be present during the application of adhesive or bonding method, the bonding procedure or the curing of any elements that require curing.

Figure 23:
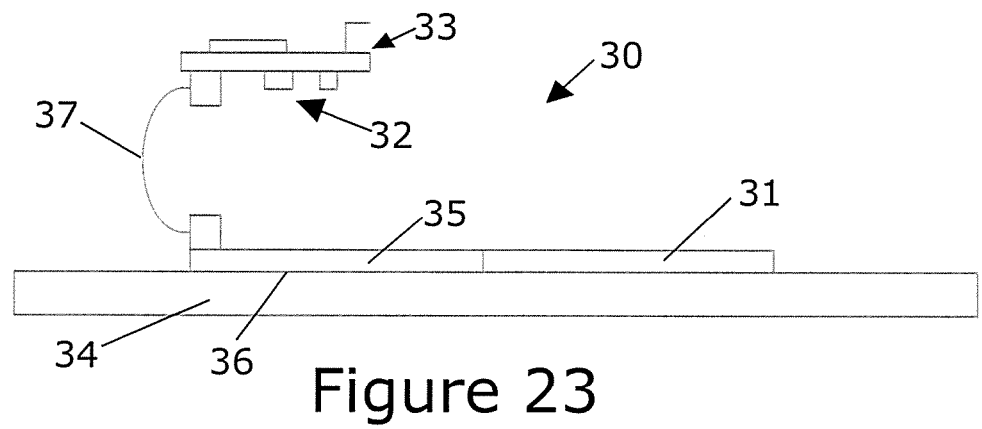
FIG. 23 shows a side elevation of an embodiment of the present invention.

FIG. 23 gives a side elevation view of a sensing apparatus 30 according to a preferred embodiment of the present invention. The sensing apparatus has an array of sensors 31. In this example the sensors are deformation sensors which have an electronic characteristic which changes with deformation of the sensors. In this example, specifically, the sensors are capacitive sensors broadly of the type illustrated with reference to FIGS. 1 and 2 and which vary in impedance all capacitance as the sensors in an array 31 are deformed. A typical deformation in the use of the sensing apparatus 30 may be stretching.

Measurements of deformation are made by sensing electronics 32 mounted on a sensing circuit board 33. The array 31 has numerous sensors with signal electrodes (not shown) and shielding electrodes (not shown) and these must be interconnected to the circuit board 33 for sensing electronics 32 to perform sensing processes.

The array of sensors 31 is mounted on substrate material 31. In this example material is flexible. In this example, specifically, the material is stretchable. As the reader will appreciate, it is important to the functioning of the apparatus is a sensing apparatus, any interconnection of the array 31 to sensing electronics 32 does not contribute to variable electronic or electrical characteristics as the sensor array or its substrate is flexible stretched.

In this example, the array is formed from films of elastomeric material of which is a material has a dispersion of particles to impart a conductive characteristic. Therefore, the array is able to stretch significantly with respect to its original length. As the reader will appreciate significant stretching of the sensor array is typical of a sensor formed from elastomeric films.

FIG. 23 shows the sensing apparatus 30 having an interconnect 35. In this example the interconnect is a circuit board.

The interconnect 35 has a contact surface 36 which is of a type known to the reader, be suitable for bonding to the flexible substrate 34.

Figure 24:
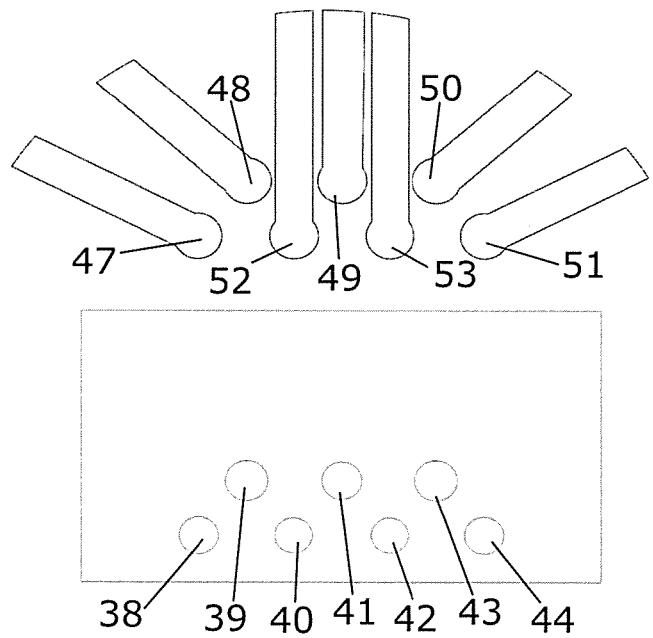
FIG. 24 shows an interconnect and part of a sensor array of the embodiment of the present invention of FIG. 23.

FIG. 24 shows an interconnect 35 according to the same embodiment of the present invention as shown in FIG. 23. The interconnect has a contact surface 36 with a set of sensor terminals 38, 39, 40, 41, 42, 43, 44 arranged in a pattern. In this example the pattern is a row 45 of terminals offset from a parallel row 46. The terminals of this embodiment have metal contacts with an aperture to receive conductive elastomeric material applied on an opposite side of the interconnect 35 from the contact surface 36. The conductive elastomeric material is received in a ductile, pre-cured state which is then cured to bond and connect terminals 38-44 to terminals 47-53.

FIG. 24 also shows a set of terminals 41 for the sensor array 31. The terminals of this embodiment formed of conductive elastomeric material. The sensor array 31 of this embodiment have five deformation sensors and FIG. 24 shows five signal terminals 42, 43, 44, 45 and 46 provided for signal electrodes of capacitive sensors in the array 31. FIG. 24 also shows to ground terminals 47 and 48 for shielding electrodes. The two ground terminals 47 and 48, in this particular embodiment, are each connected to one or other of the upper lower shielding electrodes, such as exemplified as 3 or 4 shown in FIG. 2. FIG. 24 shows the terminals 38-44 to have a cooperating pattern to a pattern in which terminals 47 to 51 are laid out.

Figure 25:
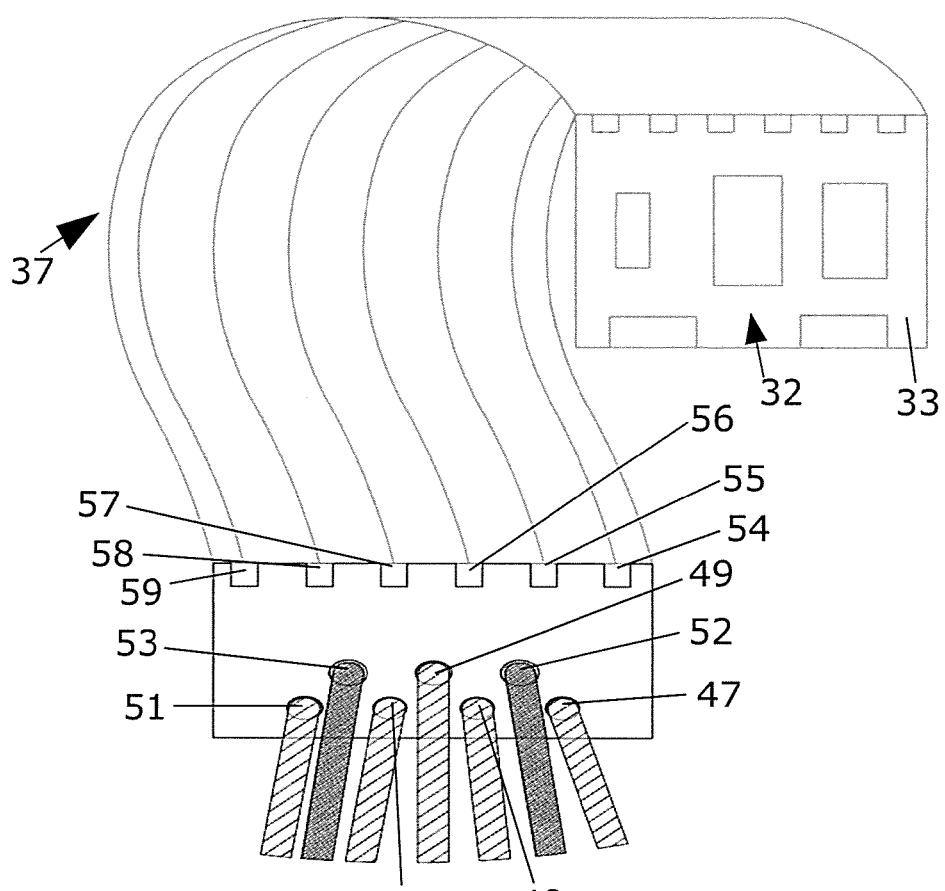
FIG. 25 shows a perspective view of part of a sensor apparatus of the embodiment of FIG. 23.

FIG. 25 gives a perspective view of part of sensor apparatus 30 of FIG. 23 and FIG. 24. In FIG. 25 the circuit board 33 is shown mechanically coupled from, though electrically connected to, the interconnect 35. FIG. 25 shows sensing terminals 54-59 in addition to parts illustrated in FIG. 23 such as sensor array 31, sensing electronics 32 sensor board 33, cable 37, and terminals 38-44, 47, 49 and 51-53.

Figure 26:
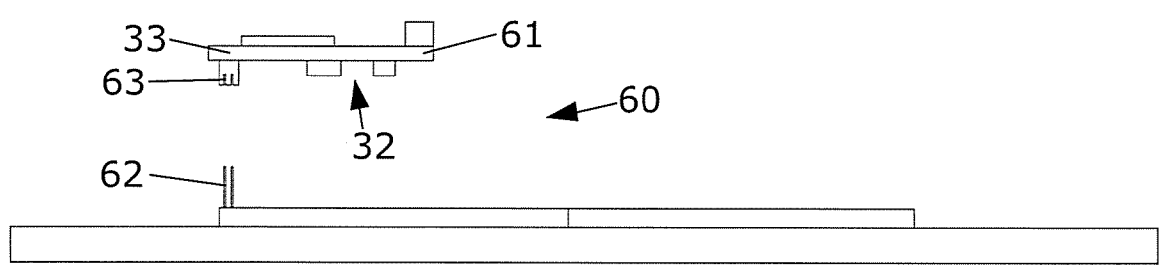
FIG. 26 shows a side elevation of a sensing apparatus according to a further embodiment of the present invention.

FIG. 26 shows a sensing apparatus 60 according to an alternative embodiment of the present invention to that of FIG. 23. In the embodiment of FIG. 26 interconnect 62 has a plug 63 which is able to connect to the circuit board 61 and also to support the circuit board 61.

As shown in FIG. 23, coaxial, shielded cable 37 to connect sensing terminals (not shown) on the interconnect 35 to interconnect the circuit board 33 via sensing terminals (not shown) on the contact surface 36.

In alternative embodiments the interconnect may be formed of flexible circuit sheet, such as a fabric or flexible material with conductive tracks formed thereon.

In an alternate embodiment the coaxial cables 37 of embodiment of FIG. 23 are substituted by the flexible circuit, often referred to as a flex printed circuit board or flex PCB.

In a further embodiment the interconnect 35 of FIG. 23 as well as the collective cables are substituted by a flex PCB which has terminals for connecting to sensors, shielded tracks from those terminals to terminals for a sensor circuit board, similar to that indicated by 33 in FIG. 23.

In a further embodiment a sensing apparatus, similar to that indicated by one in FIG. 23, or similar to that indicated by 60 in FIG. 26, has an over mould off elastomeric conductive material connected to ground terminals to provide shielding for the signal terminals, such as those indicated by 47 to 51 in FIG. 24.

In another embodiment an interconnect, such as exemplified by 35 in FIG. 23, has ground terminals, such as exemplified as 52 and 53 in FIG. 24, on an opposite side of the to connect 35 to the contact surface 36. In various embodiments traces leading from sensors, or ends of sensor electrodes, are left unbonded from the substrate, such as exemplified by 34 in FIG. 23, until they are bonded to the interconnect 35.

The following description details a possible addition to the invention mentioned so far which could potentially increase the mechanical robustness of a connection between a flexible electronic component and a rigid electronic component. This addition of a pin or similar mechanical attachment method as and/or a leaf spring or similar mechanical force application method could reduce relative motion of the flexible electronic component and rigid electronic component to ensure that the electrical pathway created by the connection of the flexible and rigid electronic components continues to function as part of an electronic circuit.

FIG. 53 shows an interconnection device, or interconnect, 101 which according to an embodiment of the present invention. The interconnect 101 electrically and mechanically connects a first electronic component 102 to a second electronic component 103. The first electronic component 102 in this example is a soft electronic component. In this particular example the soft electronic component 102 is stretchable. The soft electronic component 102 has terminals 104a and 104b which the interconnect 101 connects to respective contact terminals 105a and 105b provided on the second electronics component 102. In this example the contact terminals 104a and 104b oppose the contact terminals 105a and 105b.

The device one has contact elements 106a and 106b formed of a conductive material which is compressible between terminals 104 and 105. In this example, the material used for the contact elements 106 is a matrix material having a dispersion of particles to impart a conductive property. In this specific example the materials used are silicone with the dispersion of carbon particles. In this example the contact elements 106 are provided as projections bonded to the terminals 104. In the example shown in FIG. 53, the soft electronic component 102 is bonded to a stretchable substrate. In this example the substrate 107 is a stretchable fabric.

The second electronic component of this example is a printed circuit board. In this particular example the printed circuit board 103 is rigid.

The circuit board 103 has an aperture 108 for a pin 109. The pin 109 connects the circuit board 108 to a biasing element 110. In this example the biasing element 110 is a leaf spring which is biased by the pin 108 and the board 103 so as to act to pull the pin downwards in the page shown.

The device 101 has a stretch-resistant element 111 bonded to the stretchable substrate 107 to which the stretchable electronic component 102 is bonded. As shown in this example, the stretch-resistant element 111 extends just beyond the contacts 104a and 104b and contact elements 106a and 106b, or just wider than their separation. The stretch-resistant element 111 has an aperture 112 to receive the pin 109. The compressed spring 110 bears against the stretch-resistant element 111 to provide a force for the stretch-resistant element 111 and contacts 104, under compression provided by the pin 109, towards the terminals 105 of the circuit board 3.

The device 101 also has a layer 112a of complaint material over-moulded over the terminals 104 and 105, contact elements 106, circuit board 103, pin 109 and part of the stretchable electronic component 102 in a region where it connects to the printed circuit board 102.

The device 101 also has an over-moulded layer 112b complaint material moulded over the pin 109, spring 110 stretch-resistant element 111 and fabric substrate 107.

The operation of the device will now be described. The pin 109 anchors in the circuit board 103 at the aperture 108 in the circuit board 103 and provides tension to compress and flatten the leaf spring 110 towards the circuit board 103. The leaf spring 110 bears against the stretch-resistant element 111, which is bonded to the stretchable electronic component 102 in a region which includes the terminals for and contact elements 106. The action of the leaf spring 110 forces the terminals 104 towards terminals 105. The terminals 105 resist the force by the rigidity of the circuit board 102 and the action of the pin 109. The reader will appreciate that the anchor aperture 108, pin 109, leaf spring 110 bearing on stretch-resistant element 111 collectively provide a biasing mechanism to bias the stretch-resistant element 111 and the terminals 104 towards the circuit board 103 and terminals 105. This biasing also compresses the contact elements 106 which are resilient and therefore provide a firm electrical interconnection of the terminals 104 and 105 and a firm mechanical connection of the soft electronic component 102 to circuit board 103. The stretch-resistant element 111, which is bonded to the substrate 107, provides a stretch-resistant region of the soft electronic component 102. The stretch-resistant region encapsulates the terminals 104 and mitigates movement of terminals 104 relative to terminals 105. Otherwise compression may otherwise cause misalignment of the terminals 104 by stretching of the fabric substrate 107 and soft electronic component 102.

The reader will be aware that the pin 109 is acting as a tension element between the circuit board 103 and the compressed leaf spring 110. The degree of compression of the spring can be determined in part by the length of the pin 109. The compressed leaf spring 110, which is compressed by tension through the pin 109, acts to force the terminals 104a and 104b towards the terminals 105a and 105b and to compress the contact element 106a and 106b between the terminals.

Further in traditional embodiments will now be described.

In some embodiments the soft electronic component is deformable.

In some embodiments the soft electronic component has variable geometry to vary electronic characteristics.

An embodiment of the present invention provides a process for manufacturing a device comprising a first electronic component connected to a second electronic component, wherein the first electronic component stretchable.

In one step of the process of one embodiment stretch-resistant element is affixed to the first electronic component so as to provide a non-stretchable region for the one of more of the one or more contacts provided on the first soft electronic component.

In another step of the process of one embodiment contact elements formed of conductive material are affixed to terminals of the soft electronic component.

In another step of the process of one embodiment contact elements are located between respective contacts on the first and second electronic components.

In another step of one embodiment a bias mechanism is arranged to compress the one or more contact elements between respective contacts provided on the first and second electronic components.

Embodiments of the present invention provide mechanical as well as electrical interconnection of electronic components.

Embodiments of the present invention mitigate challenges in aligning contacts of a stretchable electronics component which arise from the ability of the component to stretch.

Embodiments of the present invention provide a low-profile biased interconnection of soft electronic components, or smart fabrics, and particularly stretchable soft electronic components.

Embodiments of the present invention provide a low-profile interconnection which is suitable for over moulding.

In some embodiments the soft electronic components is a sensors operable to stretch and provide an impedance or capacitance characteristic which varies with stretch to allow a connected sensing electronic circuit to sense and/or measure stretch.

In some embodiments of the invention the stretch-resistant element is rigid.

In various embodiments the first electronic component is formed of a stretchable material with dispersed particles which provide conductivity.

In various alternative embodiments the stretch-resistant element maybe a flexible sheet of material.

In various alternative embodiments the stretch-resistant element may not extend from the centre of the assembly and may instead form an annulus, or a peripheral band, to provide the stretch-resistant region only in an annulus or band where the contact elements are located.

In some embodiments a soft electronic component is formed of films of elastomeric material.

In some embodiments a soft electronic component is formed of layered of films of elastomeric material.

In some embodiments have two or more films with a dispersion of particles which impart a conductive property to form electrodes and have one or more films with a dielectric property wherein the one or more dielectric films separate the electrodes to form a capacitance.

Various embodiments comprise a soft electronic component an electrical characteristic which varies with deformation to provide a sensor, generator or actuator.

In some embodiments the electrical characteristic is capacitance.

In various embodiments an electrical characteristic is capacitance.

In some of these embodiments the capacitances are the range of hundreds of Picofarads.

In various embodiments an electrical characteristic to be used is inductance.

In various embodiments an electrical characteristic used for sensing is a characteristic which is referenced to earth or to a shielding electrode. For example capacitance of a signal electrode which stretches may be the capacitance between the signal electrode and one or more shielding electrodes and may be a result of deformation in both the shielding electrode and the signal electrode as well as, in some cases, dielectric layers separating these.

In some embodiments variation in electrical characteristic of a sensor is used for sensing deformation or changes in deformation.

In some embodiments variation in electrical characteristic is used for generating power.

In some embodiments power is generated using a soft electronic component by holding a priming charge on the component while the electrical characteristic changes. In some embodiments the priming charge is held while the geometry of the component is varied.

In some embodiments soft electronic components are used to generate mechanical force.

In some embodiments the component comprises elastomeric material to provide dielectric layers or patterns and elastomeric material with dispersed material to provide conductive layers or patterns.

In some embodiments the material used to provide a soft electronic component such as a sensor is an elastic material.

In some embodiments material used to provide a soft electronic component and/or a contact element is a silicone-based material.

In some embodiments electrodes and/or contact elements are formed of a similar material to that of dielectric layers.

In some embodiments the electrodes are conductive due to conductive materials, such as particles, being added to a material.

In some embodiments both the material of the electrodes and the material of dielectric layers have a similar stretch and/or compliance and/or elastic properties.

In some embodiments an electrical device is formed of layers or films of materials which are formed of material which is initially liquid and then set or cured.

Some embodiments are formed using casting to manufacture a layer of a soft electronic component. The casting of some embodiments uses a cast into which a material to be deposited is applied. In some embodiments the casting is used to apply a layer of conductive material in a defined pattern. The casing may use casts as pattern elements, which define patterns. The resulting product of some embodiments has a layer of the soft electronic component defined by a cast. Some embodiments have a cast layer.

Some embodiments are formed using patterning sheet in the form of a stencil to deposit a layer of a soft electronic component and/or a pattern of signal electrodes and cable conductors. The stencilling of some embodiments uses stencils as pattern elements, which define patterns for layers and/or a pattern of soft electronic components. Some embodiments have a resulting product with a stencilled layer.

Some embodiments are formed using a process which uses a patterning sheet in the form of a screen to deposit by screen printing a layer of a soft electronic component and/or a pattern of signal electrodes and cable conductors. The printing of some embodiments uses screens as pattern elements, which define patterns for layers and/or a pattern of soft electronic components. Some embodiments have a resulting product with a screen-printed layer.

Some embodiments are formed using digital printing to deposit a layer of a soft electronic component and/or a pattern of signal electrodes and cable conductors. The printing of some embodiments uses computer controlled dispensing heads as pattern elements, which define patterns for layers and/or a pattern of soft electronic components. Some embodiments have a resulting product with a digitally printed layer.

Some embodiments are formed using flexography printing to deposit a layer of a soft electronic component and/or a pattern of signal electrodes and cable conductors. The printing of some embodiments uses raised surfaces on planar or rotary tools as pattern elements, which define patterns for layers and/or a pattern of soft electronic components. Some embodiments have a resulting product with a flexographic layer.

Some embodiments are formed using gravure to deposit a layer of a soft electronic component and/or a pattern of signal electrodes and cable conductors. The printing of some embodiments uses embossed patterns on rotary tools as pattern elements, which define patterns for layers and/or a pattern of soft electronic components. Some embodiments have a resulting product with a gravure layer.

Some embodiments are formed using offset lithography to deposit a layer of a soft electronic component and/or a pattern of signal electrodes and cable conductors. The printing of some embodiments uses a series of rollers to transfer liquids to a substrate in patterns defined to describe a pattern of layers and/or a pattern of soft electronic components. Some embodiments have a resulting product with an offset lithography layer.

Some embodiments are formed using lamination to deposit a prefabricated layer of a soft electronic component and/or a pattern of signal electrodes and cable conductors. The lamination of some embodiments uses prefabricated patterned layers, which define patterns for layers and/or a pattern of soft electronic components and/or cables. Some embodiments have a resulting product with a laminated layer.

Some embodiments are formed using spray deposition, implantation or injection of materials.

Some embodiments are formed using digital printing such as inkjet printing.

Some embodiments have a circuit or processor which determines an electrical characteristic, such as capacitance, for a signal electrode and/or a change in an electrical characteristic determined for a signal electrode and does this dependent on an electrical characteristic and/or change in electrical characteristic determined for a cable connecting the signal electrode to a circuit. The determination dependent on in some embodiments is a deduction. In some embodiments the deduction or other determination is determined dependent on an electrical characteristic and/or change in electrical characteristic for a signal electrode associated with the cable conductor. In some embodiments the signal electrode may be associated geometrically with the cable conductor. In some embodiments the cable conductor may run alongside a signal electrode or sequence of signal electrodes so that the deformation, such as stretching or compression, occurring in the cable can be determined from the deformation occurring in the signal electrode. The reader will appreciate that deformation will involve deformation in cable conductors, signal electrodes and shielding electrodes and/or dielectric layers.

Some embodiments of the present invention have storage media storing computer executable instructions.

Some embodiments for these stretchable electronic elements are defined to continue to perform their intended function over elastic strains of 20% or more. More preferably, stretchable electronic elements continue to perform their intended function over elastic strains of 15% or more. More preferably, stretchable electronic elements continue to perform their intended function over elastic strains of 10% or more. Still more preferably, stretchable electronic elements continue to perform their intended function over elastic strains of 5% or more.

Some embodiments of the present invention have non-stretchable components which stretch under stress applied to stretchable component in use by 5% of their original dimension or less.

In the preceding description and the following claims the word "comprise" or equivalent variations thereof is used in an inclusive sense to specify the presence of the stated feature or features. This term does not preclude the presence or addition of further features in various embodiments.

It is to be understood that the present invention is not limited to the embodiments described herein and further and additional embodiments within the spirit and scope of the invention will be apparent to the skilled reader from the examples illustrated with reference to the drawings. In particular, the invention may reside in any combination of features described herein, or may reside in alternative embodiments or combinations of these features with known equivalents to given features. Modifications and variations of the example embodiments of the invention discussed above will be apparent to those skilled in the art and may be made without departure of the scope of the invention as defined in the appended claims.

What we claim is:

1. An interconnect between a stretchable electronic element and an electronic circuit, the stretchable electronic element operable to be mechanically coupled to a substrate which deforms, the stretchable electronic element remaining functionally operable when the substrate is deformed, and the stretchable electronic element comprising one or more electrical pathways; the electronic circuit configured to electronically communicate with the stretchable electronic element and comprising at least one circuit board; wherein the interconnect comprises an electrical coupling between the electrical pathways of the stretchable electronic element and the circuit board of the electronic circuit, and wherein
the stretchable electronic element includes a sensor, the sensor mechanically coupled to the substrate which deforms and operable to change an electrical characteristic to instrument deformation of the substrate, the sensor including one or more of the electrical pathways; and
the circuit board is configured to form part of an electrical circuit including the sensor.

2. An interconnect as claimed in claim 1, wherein the interconnect comprises an electrical conductor extending normal to the surface of the electrical pathways of the stretchable electronic element, the electrical conductor including the electrical coupling between the electrical pathways of the stretchable electronic element and the circuit board.

3. An interconnect as claimed in claim 1, wherein the interconnect comprises landing pads disposed between the electrical pathways of the stretchable electronic element and the circuit board and/or the landing pads are integrally part of the electrical pathway of the stretchable electronic element, wherein the circuit board comprises a connecting pad comprising a conductive pad on a lower or contacting surface and wherein the conductive pad comprises one or more cavities that are substantially aligned with the landing pads of the stretchable electronic element.

4. An interconnect as claimed in claim 3, wherein the landing pads extend at least partially into the one or more cavities in the conductive pad.

5. An interconnect as claimed in claim 3, wherein the inner surfaces of the one or more cavities are partly or fully coated by electrically conductive material connected to the-electrical pathways of the circuit board.

6. An interconnect as claimed in claim 5, wherein the one or more cavities in the conductive pad have a structure such that a planar area of a conductive material of the conductive pad that is most distal from the surface of the circuit board is larger than the area of the conductive material of a plane more proximate to the circuit board to create an overhanging region.

7. An interconnect as claimed in claim 3, wherein the one or more cavities are filled or injected with liquid which is subsequently cured or set to provide electrically conductive material and form a cooperating shape to the one or more cavities.

8. An interconnect as claimed in claim 3, wherein the conductive pad comprises multiple cavities that are aligned with a single electrical pathway on the circuit board.

9. An interconnect as claimed in claim 3, wherein the circuit board is secured to the stretchable substrate so as to create a bias pressure forcing the landing pads of the stretchable electronic component and the conductive pads on the circuit board together such that the landing pads are elastically deformed.

10. An interconnect as claimed in claim 9, wherein the bias pressure is provided by a fastener to hold the interconnect region in an elastically compressed state.

11. An interconnect as claimed in claim 3, wherein the one or more cavities extend all the way through the circuit board to form vias, the vias over filled with liquid electrically conducting material and form a solid with a larger cross-sectional area than that of the via on the opposite side of the circuit board to the stretchable substrate.

12. An interconnect as claimed in claim 1, wherein the circuit board is additionally bonded to the stretchable substrate by use of an adhesive or fastener to ensure alignment of the conductive pathways.

13. An interconnect as claimed in claim 1, wherein a strain resistant layer is secured to the side of the stretchable substrate distal to the electrical circuit board to form a laminate with the stretchable substrate in the middle by one of an adhesive and/or fastener.

14. An interconnect as claimed in claim 13, wherein the strain resistant layer is at least the same size as the planar area of the circuit board and aligned with the circuit board to substantially eliminate strain parallel to the surface of the circuit board where the landing pads and the conductive pads are electrically connected.

15. An interconnect as claimed in claim 13, wherein the strain resistant layer is a flexible but substantially non-stretchable sheet.

16. An interconnect as claimed in claim 13, wherein the strain resistant layer is a rigid sheet.

17. An interconnect as claimed in claim 1, wherein the circuit board is bonded to the stretchable substrate by use of an adhesive, and wherein an adhesive layer forms a tapered region of tapered thickness starting from substantially the thickness of the circuit board at the perimeter of the circuit board and tapering down to the thickness of the stretchable electronic component over a distance of several millimeters in the direction extending perpendicularly outwards from the perimeter of the circuit board.

18. An interconnect as claimed in claim 17, wherein the circuit board is additionally bonded to the stretchable substrate by use of a mechanical fastener to ensure alignment of the conductive pathways.

* * * * *